(12) United States Patent
Gaul et al.

(10) Patent No.: US 12,453,170 B2
(45) Date of Patent: Oct. 21, 2025

(54) INTEGRATION OF NANOSHEETS WITH BOTTOM DIELECTRIC ISOLATION AND IDEAL DIODE

(71) Applicant: International Business Machines Corporation, Armonk, NY (US)

(72) Inventors: Andrew Gaul, Halfmoon, NY (US); Anthony I. Chou, Guilderland, NY (US); Julien Frougier, Albany, NY (US); Andrew M. Greene, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 627 days.

(21) Appl. No.: 17/894,827

(22) Filed: Aug. 24, 2022

(65) Prior Publication Data
US 2024/0072041 A1 Feb. 29, 2024

(51) Int. Cl.
*H01L 27/06* (2006.01)
*H01L 21/02* (2006.01)
(Continued)

(52) U.S. Cl.
CPC ..... *H10D 84/811* (2025.01); *H01L 21/02603* (2013.01); *H01L 21/26513* (2013.01);
(Continued)

(58) Field of Classification Search
CPC ...... H10D 84/811; H10D 8/041; H10D 8/825; H10D 30/014; H10D 30/031; H10D 30/43;
(Continued)

(56) References Cited

U.S. PATENT DOCUMENTS 8,754,486 B2  6/2014 Lee et al.
8,994,108 B2  3/2015 Chang et al.
(Continued)

FOREIGN PATENT DOCUMENTS

WO  2024/041860 A1  2/2024

OTHER PUBLICATIONS

Guan, G. et al., "Functionalized Hybridization of 2D Nanomaterials," Advanced Science, 6(23), 1901837 (Oct. 2019) (32 pages).
(Continued)

*Primary Examiner* — Tong-Ho Kim
(74) *Attorney, Agent, or Firm* — Samuel A. Waldbaum

(57) ABSTRACT

Techniques for co-integrating gate-all-around nanosheet devices having bottom dielectric isolation with an ideal vertical P-N-P diode on a common substrate are provided. In one aspect, a semiconductor structure includes: a diode in a first region of a bulk substrate, where the diode includes P-N-P vertical implanted layers present in the bulk substrate, and a single source/drain region epitaxial material disposed on the P-N-P vertical implanted layers; and a nanosheet device with a bottom dielectric isolation layer in a second region of the bulk substrate. The nanosheet device can include nanosheet channels and gates that surround a portion of each of the nanosheet channels in a gate-all-around configuration. A method of fabricating the present semiconductor structures is also provided.

20 Claims, 20 Drawing Sheets

(51) Int. Cl.
*H01L 21/265* (2006.01)
*H01L 29/06* (2006.01)
*H01L 29/423* (2006.01)
*H01L 29/66* (2006.01)
*H01L 29/775* (2006.01)
*H01L 29/786* (2006.01)
*H01L 29/861* (2006.01)
*H10D 8/00* (2025.01)
*H10D 8/01* (2025.01)
*H10D 30/01* (2025.01)
*H10D 30/43* (2025.01)
*H10D 30/67* (2025.01)
*H10D 62/10* (2025.01)
*H10D 84/80* (2025.01)

(52) U.S. Cl.
CPC .............. *H10D 8/041* (2025.01); *H10D 8/825* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01)

(58) Field of Classification Search
CPC ........... H10D 30/6735; H10D 30/6757; H10D 62/121; H10D 8/00; H10D 62/151; H10D 64/017; H10D 62/117; H01L 21/02603; H01L 21/26513; B82Y 10/00
USPC ....................................................... 257/350
See application file for complete search history.

(56) References Cited

U.S. PATENT DOCUMENTS

| | | | |
|---|---|---|---|
| 9,490,323 B2 | 11/2016 | Rodder et al. | |
| 9,847,391 B1 | 12/2017 | Zang et al. | |
| 9,991,334 B2 | 6/2018 | Bi et al. | |
| 10,032,856 B1 | 7/2018 | Bao et al. | |
| 10,157,935 B2 | 12/2018 | Cheng et al. | |
| 10,170,548 B2 | 1/2019 | Cheng et al. | |
| 10,304,926 B2 | 5/2019 | Zhou | |
| 10,504,890 B2 | 12/2019 | Cheng et al. | |
| 11,189,713 B2 | 11/2021 | Xie et al. | |
| 2014/0117490 A1 | 5/2014 | Yamashita et al. | |
| 2014/0217364 A1 | 8/2014 | Chang et al. | |
| 2016/0093622 A1* | 3/2016 | Luan .................... | H10D 62/133 257/133 |
| 2017/0287902 A1* | 10/2017 | Balakrishnan ..... | H10D 30/6757 |
| 2018/0102359 A1* | 4/2018 | Cheng ................ | H10D 84/0109 |
| 2022/0199615 A1 | 6/2022 | Jayanthinarasimham et al. | |

OTHER PUBLICATIONS

San Yip, P. et al., "Transistors and tunnel diodes enabled by large-scale MoS2 nanosheets grown on GaN," Semiconductor Science and Technology, 32(7), 075011 (Jun. 2017) (8 pages).

Lee, H. S. et al., "Hybrid PN Diode and CMOS Inverters Composed of MoTe2 Nanosheet-Amorphous in—Ga—Zn—O Thin Film," in ECS Meeting Abstracts (No. 10, p. 887). IOP Publishing (Apr. 2018) (3 pages).

Zhang, J. et al., "Full Bottom Dielectric Isolation to Enable Stacked Nanosheet Transistor for Low Power and High Performance Applications," 2019 IEEE International Electron Devices Meeting (IEDM) (pp. 11-16). IEEE (Dec. 2019) (5 pages).

Davis, S. "IBM Announces 2nm GAA-FET Technology—the Sum of 'Aha!' Moments," Semiconductor Digest. Retrieved from https://www.semiconductor-digest.com/ibm-announces-2nm-gaa-fet-technology-the-sum-of-aha-moments/ (Jun. 3, 2021) (10 pages).

International Search Report, International Application No. PCT/EP2023/071423, Dec. 15, 2023, 18 pgs.

* cited by examiner

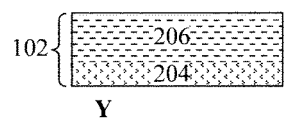
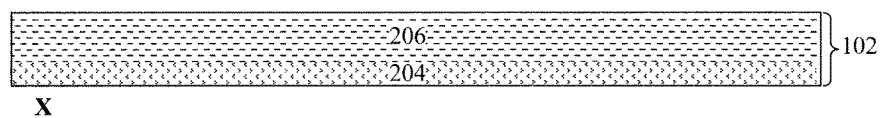
FIG. 2A  FIG. 2B
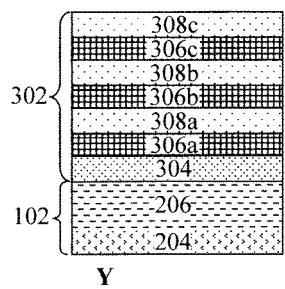
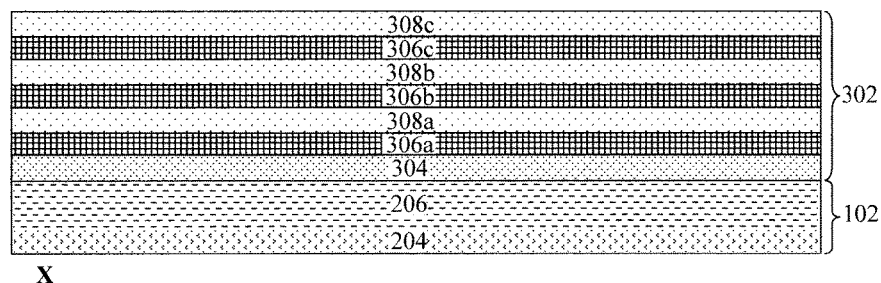
FIG. 3A  FIG. 3B
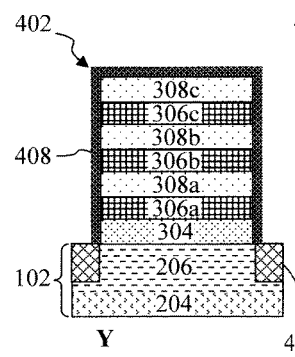
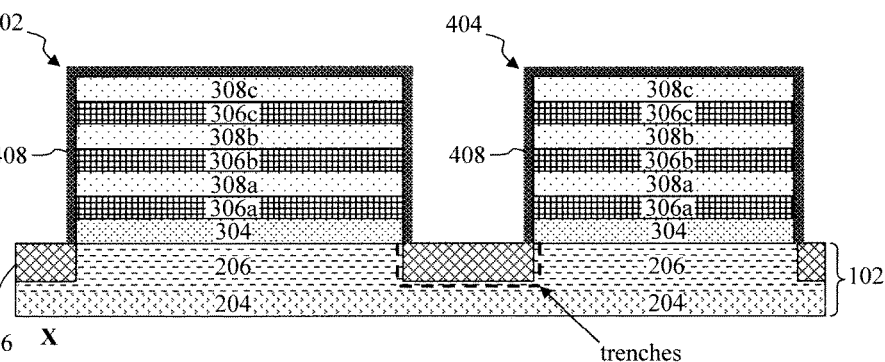
FIG. 4A  FIG. 4B

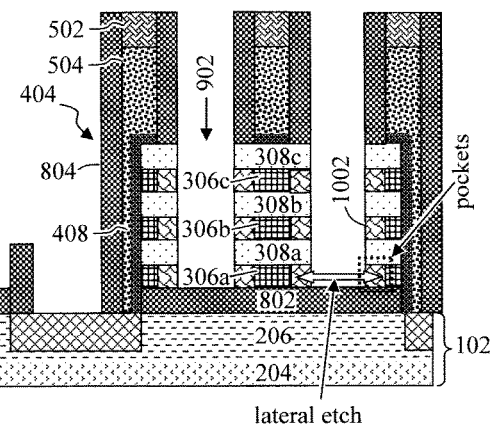
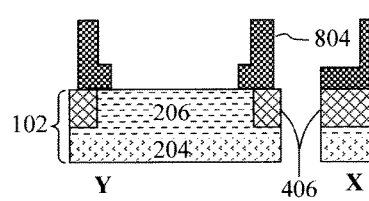
FIG. 10A  FIG. 10B
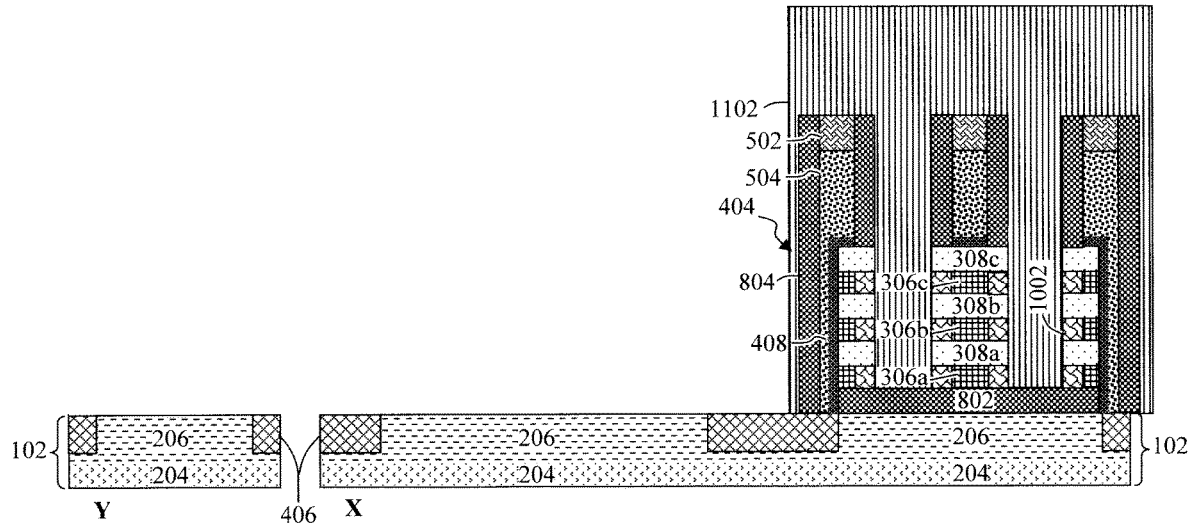
FIG. 11A  FIG. 11B

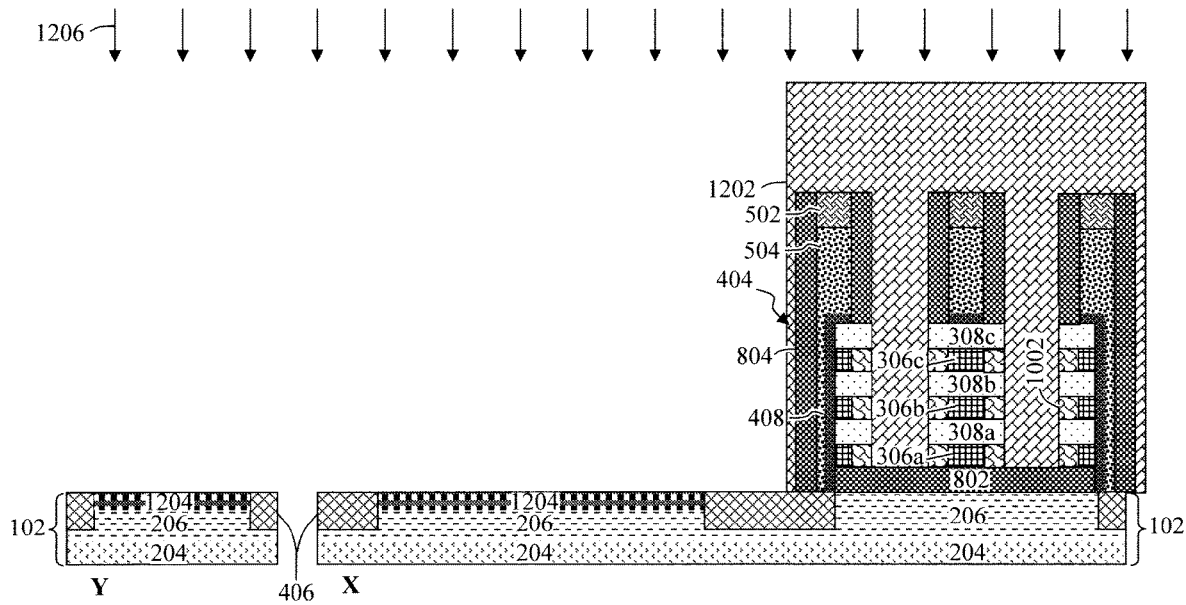
FIG. 12A  FIG. 12B
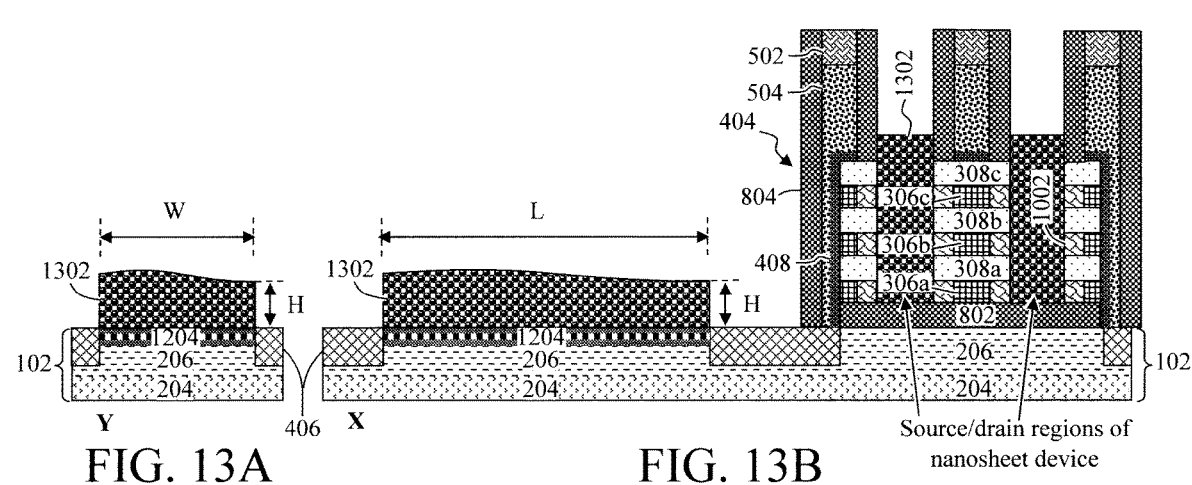
FIG. 13A  FIG. 13B  Source/drain regions of nanosheet device

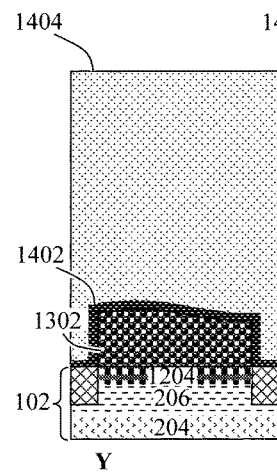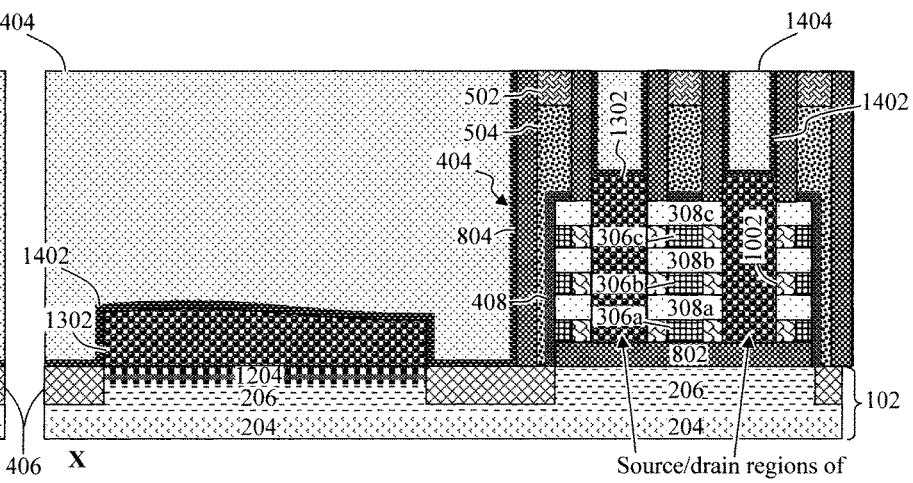
FIG. 14A
FIG. 14B
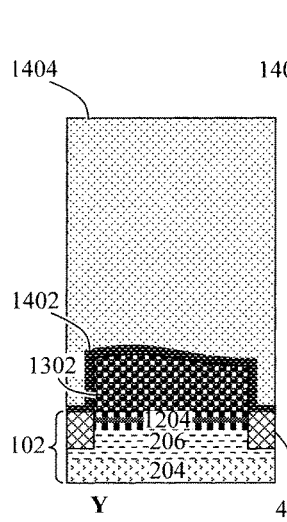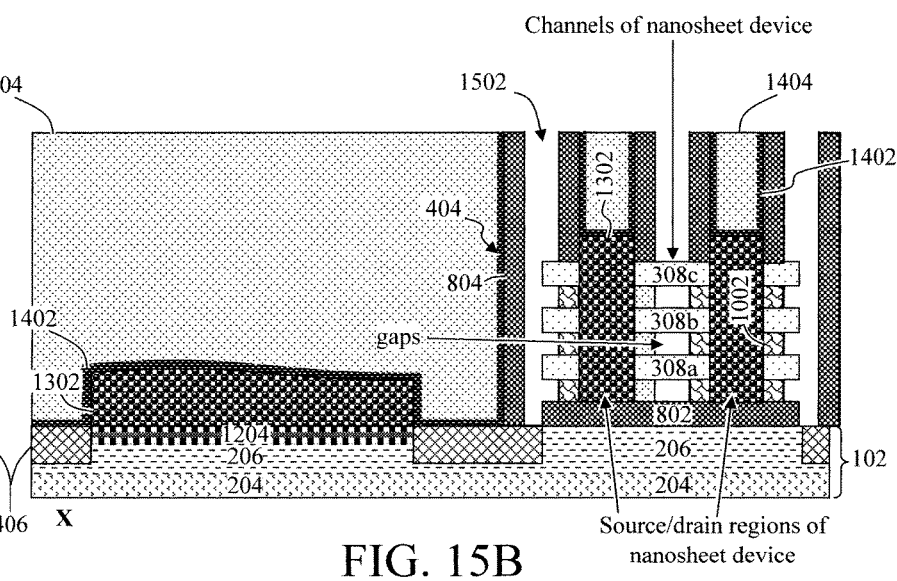
FIG. 15A
FIG. 15B

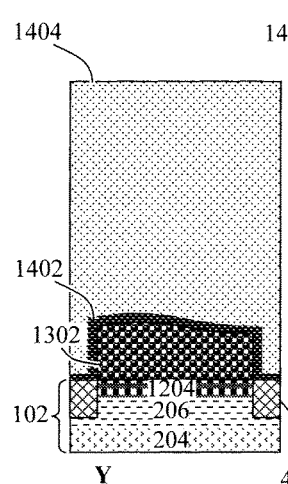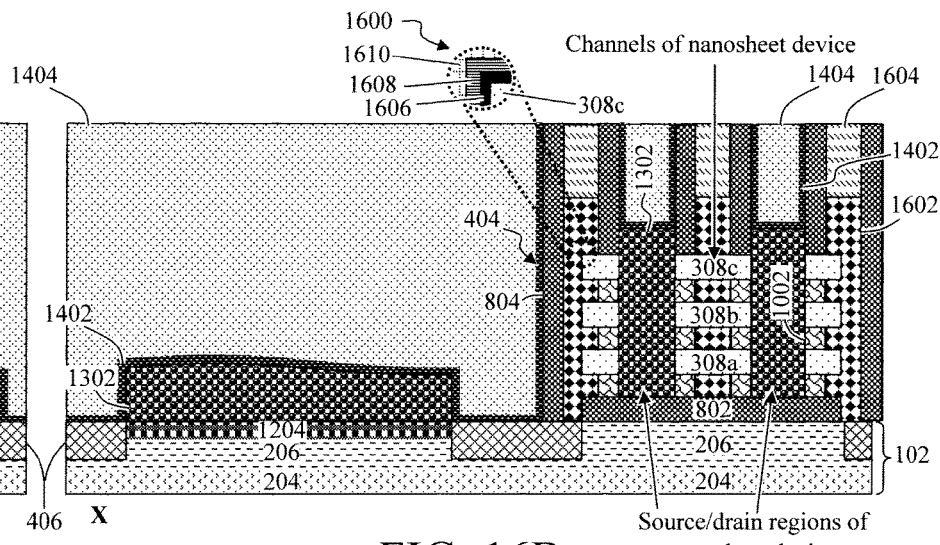
FIG. 16A  FIG. 16B
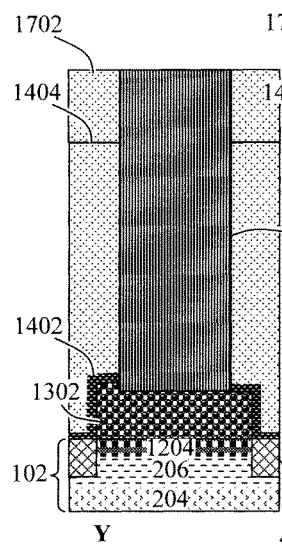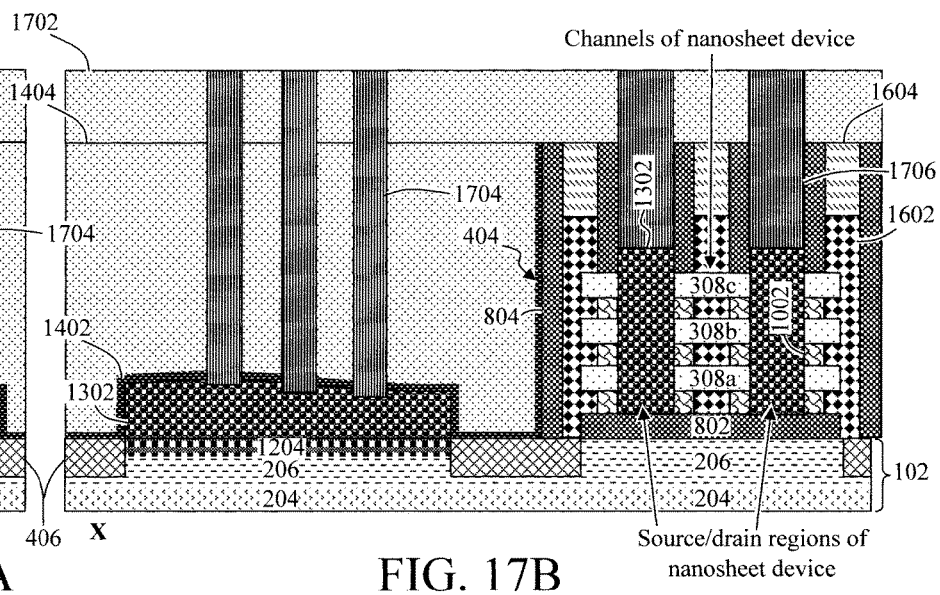
FIG. 17A  FIG. 17B

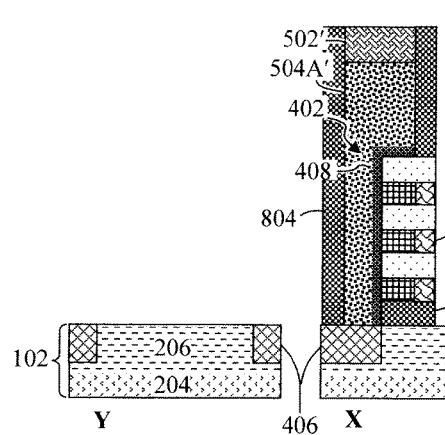
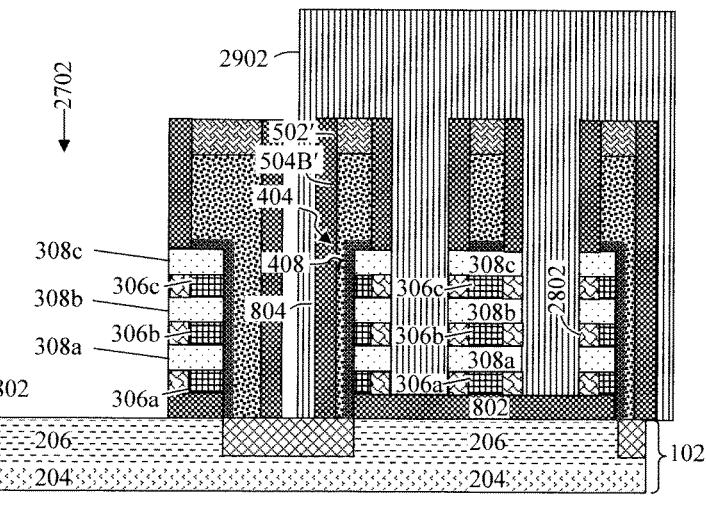
FIG. 29A  FIG. 29B
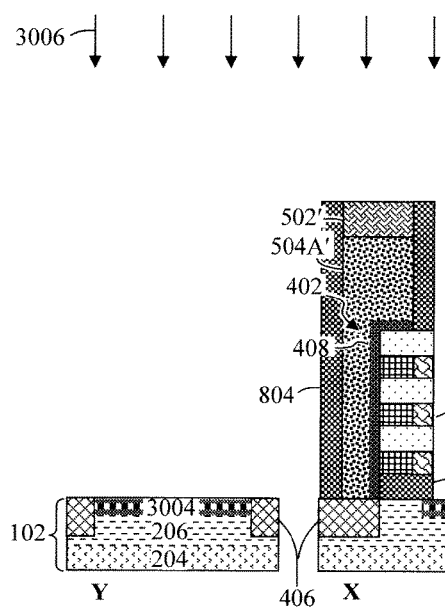
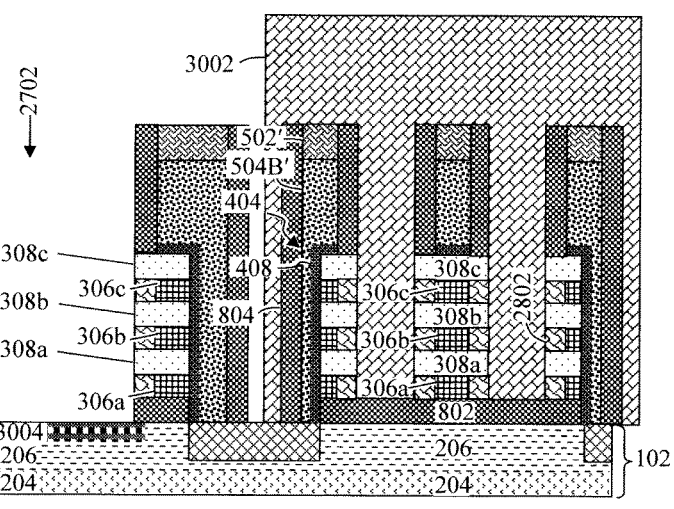
FIG. 30A  FIG. 30B

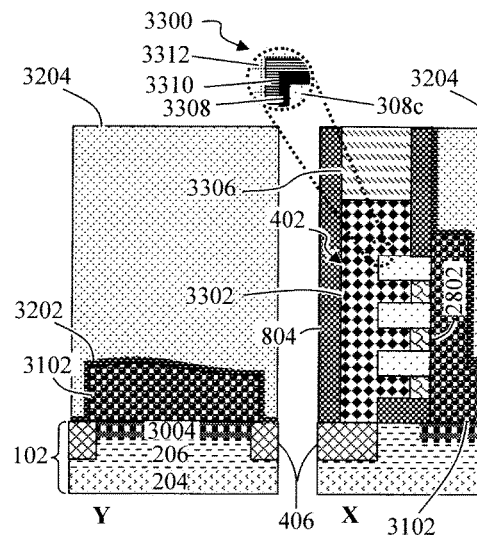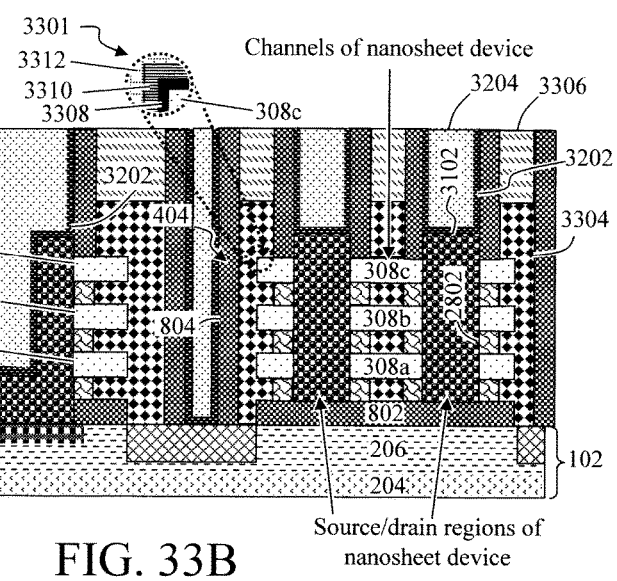
FIG. 33A  FIG. 33B
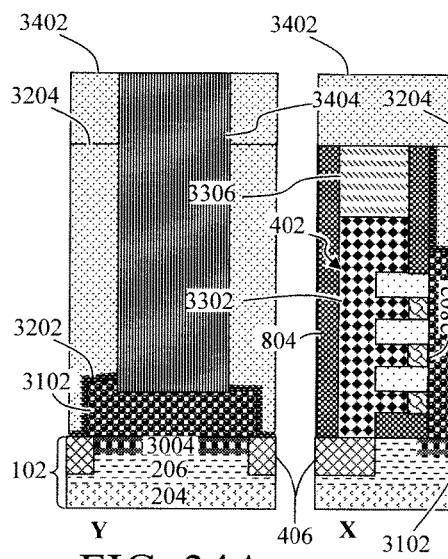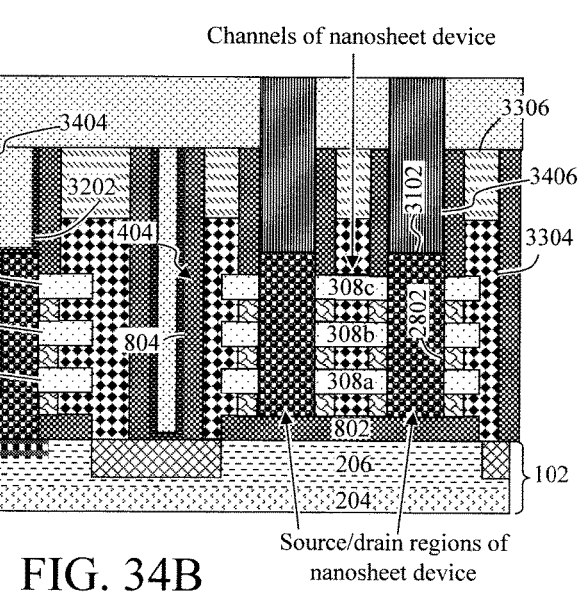
FIG. 34A  FIG. 34B

INTEGRATION OF NANOSHEETS WITH BOTTOM DIELECTRIC ISOLATION AND IDEAL DIODE

FIELD OF THE INVENTION

The present invention relates to ideal diodes and nanosheet devices with bottom dielectric isolation, and more particularly, to techniques for easily and effectively co-integrating gate-all-around nanosheet devices having bottom dielectric isolation with an ideal vertical P-N-P diode on a common substrate.

BACKGROUND OF THE INVENTION

An ideal diode, also known as a vertical P-N-P diode, is an electronic device that performs like an ideal conductor when voltage is applied in a forward bias, and like an ideal insulator when voltage is applied in a reverse bias. As its name implies, an ideal vertical P-N-P diode includes vertically-oriented n-type and p-type materials.

Semiconductor-on-insulator technologies have largely abandoned vertical P-N-P structures in favor of lateral P-N-P diodes. However, lateral P-N-P diodes are less robust, and more difficult to construct. Lateral P-N-P diodes are also less area efficient than their vertical counterparts.

Bottom dielectric isolation technology presents similar benefits to semiconductor-on-insulator configurations. Advantageously, a bottom dielectric isolation layer serves to prevent source-to-drain leakage via the device substrate. Notably, bottom dielectric isolation provides a simpler approach to device formation on the substrate, via the ability to break through the shallow bottom dielectric isolation layer.

While there are a variety of integration possibilities to form an ideal vertical P-N-P diode, there are multiple challenges to fully integrate ideal vertical P-N-P diodes with bottom dielectric isolation logic/static random access memory (SRAM) devices in a manner that is simple, cost-effective, and which requires minimal alterations to the standard integration fabrication flow.

SUMMARY OF THE INVENTION

The present invention provides techniques for easily and effectively co-integrating gate-all-around nanosheet devices having bottom dielectric isolation with an ideal vertical P-N-P diode on a common substrate. In one aspect of the invention, a semiconductor structure is provided. The semiconductor structure includes: a diode in a first region of a bulk substrate, where the diode includes P-N-P vertical implanted layers present in the bulk substrate, and a single source/drain region epitaxial material disposed on the P-N-P vertical implanted layers; and a nanosheet device with a bottom dielectric isolation layer in a second region of the bulk substrate. Advantageously, integrating the P-N-P vertical implanted layers for the diode in this manner facilitates formation and preservation of all of the implant layers. Further, various implant doses, energies, types, etc. can all be done back-to-back for different locations/functions.

For instance, the P-N-P vertical implanted layers can include: a Psub implant in the bulk substrate; an Nwell implant in the bulk substrate over the Psub implant; and a P+ implant in the second region of the bulk substrate over the Nwell implant. Optionally, a ring of the same material as the bottom dielectric isolation layer can be employed surrounding the single source/drain region epitaxial material disposed on the P-N-P vertical implanted layers. Doing so advantageously defines edge placement and prevents surface degradation. Further, gates can optionally be implemented that contact (and support) opposite ends of the single source/drain region epitaxial material disposed on the P-N-P vertical implanted layers.

In another aspect of the invention, another semiconductor structure is provided. The semiconductor structure includes: a diode in a first region of a bulk substrate, where the diode includes P-N-P vertical implanted layers present in the bulk substrate, and a single source/drain region epitaxial material disposed on the P-N-P vertical implanted layers; and a nanosheet device with a bottom dielectric isolation layer in a second region of the bulk substrate, where the nanosheet device includes nanosheet channels and gates that surround a portion of each of the nanosheet channels in a gate-all-around configuration. Optionally, gates can also be implemented that contact (and support) opposite ends of the single source/drain region epitaxial material disposed on the P-N-P vertical implanted layers. In that case, the single source/drain region epitaxial material (in the first region of the bulk substrate) can contact both patterned portions of the nanosheet channels under these gates and the bulk substrate.

In yet another aspect of the invention, a method of fabricating a semiconductor structure is provided. The method includes: performing a Psub implant in a bulk substrate, including in a first region of the bulk substrate; performing an Nwell implant in the bulk substrate over the Psub implant; forming a nanosheet device with nanosheet channels and a bottom dielectric isolation layer in a second region of the bulk substrate; performing a P+ implant in the first region of the bulk substrate over the Nwell implant; and concurrently forming a source/drain region epitaxial material on the P+ implant in the first region of the bulk substrate and in source/drain regions of the nanosheet device in the second region of the bulk substrate.

For instance, a nanosheet stack can be formed on the first region and the second region of the bulk substrate. The nanosheet stack can then be selectively removed from the first region of the bulk substrate. Further, first and second gates can be concurrently formed with the first gates being formed in the first region of the bulk substrate and which contact opposite ends of the source/drain region epitaxial material, and the second gates being formed in the second region of the bulk substrate and which surround a portion of each of the nanosheet channels in a gate-all-around configuration.

A more complete understanding of the present invention, as well as further features and advantages of the present invention, will be obtained by reference to the following detailed description and drawings.

BRIEF DESCRIPTION OF THE DRAWINGS

FIG. 2A is a Y cross-sectional view illustrating a Psub implant and an Nwell implant having been formed in the substrate, and FIG. 2B is an X cross-sectional view illustrating the Psub implant and the Nwell implant having been formed in the substrate according to an embodiment of the present invention;

FIG. 3A is a Y cross-sectional view illustrating a non-limiting example of a nanosheet stack (with a first sacrificial nanosheet and alternating second sacrificial and active nanosheets) having been formed on the substrate, and FIG. 3B is an X cross-sectional view illustrating the nanosheet stack having been formed on the substrate according to an embodiment of the present invention;

FIG. 4A is a Y cross-sectional view illustrating the nanosheet stack having been patterned into individual first/second stacks over a first Region I (a diode active area) and a second Region II (a logic/SRAM active area) of the substrate, respectively, shallow trench isolation regions having been formed in the substrate between the stacks, and a sacrificial gate oxide having been formed on a top and along sidewalls of the stacks, and FIG. 4B is an X cross-sectional view illustrating the nanosheet stack having been patterned into the individual first/second stacks over the first Region I (the diode active area) and the second Region II (the logic/SRAM active area) of the substrate, respectively, the shallow trench isolation regions having been formed in the substrate between the stacks, and the sacrificial gate oxide having been formed on a top and along sidewalls of the stacks according to an embodiment of the present invention;

FIG. 10A is a Y cross-sectional view illustrating the (recessed) dielectric spacers in the diode active area/Region I, and FIG. 10B is an X cross-sectional view illustrating inner spacers having been formed alongside the sacrificial nanosheets in the logic/SRAM active area/Region II stack according to an embodiment of the present invention;

FIG. 11A is a Y cross-sectional view illustrating an etch having been performed to remove what remains of the bottom dielectric isolation layer and the dielectric spacers from the diode active area/Region I, and FIG. 11B is an X cross-sectional view illustrating a block mask having been formed over/masking the logic/SRAM active area/Region II stack, and the etch having been performed to remove what remains of the bottom dielectric isolation layer and the dielectric spacers from the diode active area/Region I according to an embodiment of the present invention;

FIG. 12A is a Y cross-sectional view illustrating a P+ implant having been formed in the diode active area/Region I of the substrate over the Nwell implant, and FIG. 12B is an X cross-sectional view illustrating an implant mask having been formed over/masking the stack in the logic/SRAM active area/Region II, and the P+ implant having been formed in the diode active area/Region I of the substrate over the Nwell implant according to an embodiment of the present invention;

FIG. 13A is a Y cross-sectional view illustrating a source/drain region epitaxial material having been grown on the substrate over the Psub implant/Nwell implant/P+ implant in the diode active area/Region I, and FIG. 13B is an X cross-sectional view illustrating the source/drain region epitaxial material having been grown concurrently on both the substrate over the Psub implant/Nwell implant/P+ implant in the diode active area/Region I, and in the trenches on opposite sides of the sacrificial gates in the logic/SRAM active area/Region II to form source/drain regions of the nanosheet logic/SRAM device according to an embodiment of the present invention;

FIG. 14A is a Y cross-sectional view illustrating a contact etch stop liner having been deposited over the source/drain region epitaxial material in the diode active area/Region I, followed by a (first) interlayer dielectric, and FIG. 14B is an X cross-sectional view illustrating the contact etch stop liner having been deposited over the source/drain region epitaxial material in the diode active area/Region I and in the logic/SRAM active area/Region II, followed by the first interlayer dielectric according to an embodiment of the present invention;

FIG. 15A is a Y cross-sectional view illustrating the first interlayer dielectric covering the diode active area/Region I during sacrificial gate removal, and FIG. 15B is an X cross-sectional view illustrating the sacrificial gate hardmasks, sacrificial gates and sacrificial gate oxide having been removed forming gate trenches in the first interlayer dielectric over the stack in the logic/SRAM active area/Region II between the source/drains regions of the nanosheet device, and the sacrificial nanosheets having been selectively removed from the stack in the logic/SRAM active area/Region II through the gate trenches forming gaps between the active layers in the channel region of the nanosheet device according to an embodiment of the present invention;

FIG. 16A is a Y cross-sectional view illustrating the first interlayer dielectric covering the diode active area/Region I during replacement gate formation, and FIG. 16B is an X cross-sectional view illustrating replacement gates having been formed in the gate trenches and the gaps that fully surround a portion of each of the active nanosheets in the logic/SRAM active area/Region II stack in a gate-all-around configuration, and dielectric caps having been formed in the gate trenches over the replacement gates according to an embodiment of the present invention;

FIG. 17A is a Y cross-sectional view illustrating a (second) interlayer dielectric having been deposited onto the first interlayer dielectric in the diode active area/Region I, and (first) source/drain contacts having been formed in the first and second interlayer dielectrics over, and in direct contact with, the source/drain region epitaxial material in the diode active area/Region I, and FIG. 17B is an X cross-sectional view illustrating the second interlayer dielectric having been deposited onto the first interlayer dielectric in both the diode active area/Region I and the logic/SRAM active area/Region II, and (first and second) source/drain contacts having been formed in the first and second interlayer dielectrics over, and in direct contact with, the source/drain region epitaxial material in the diode active area/Region I and the logic/SRAM active area/Region II, respectively, according to an embodiment of the present invention;

FIG. 29A is a Y cross-sectional view illustrating an etch having been performed to remove exposed portions of the bottom dielectric isolation layer and the dielectric spacers from horizontal surfaces in the diode active area/Region I, and FIG. 29B is an X cross-sectional view illustrating a block mask having been formed over/masking the stack in the logic/SRAM active area/Region II, and the etch having been performed to remove the exposed portions of the bottom dielectric isolation layer and the dielectric spacers from horizontal surfaces in the diode active area/Region I according to an embodiment of the present invention;

FIG. 30A is a Y cross-sectional view illustrating a P+ implant having been formed in the diode active area/Region I of the substrate over the Nwell implant, and FIG. 30B is an X cross-sectional view illustrating an implant mask having been formed over/masking the stack in the logic/SRAM active area/Region II, and the P+ implant having been formed in the diode active area/Region I of the substrate over the Nwell implant in between the first sacrificial gates according to an embodiment of the present invention;

FIG. 33A is a Y cross-sectional view illustrating the first interlayer dielectric covering the diode active area/Region I during replacement gate formation, and FIG. 33B is an X cross-sectional view illustrating first/second replacement gates having been formed in the first/second gate trenches and the gaps that fully surround a portion of each of the active nanosheets in the diode active area/Region I stack and the logic/SRAM active area/Region II stack in a gate-all-around configuration, and dielectric caps having been formed in the first/second gate trenches over the first/second replacement gates according to an embodiment of the present invention;

FIG. 34A is a Y cross-sectional view illustrating a (second) interlayer dielectric having been deposited onto the first interlayer dielectric in the diode active area/Region I, and (first) source/drain contacts having been formed in the first and second interlayer dielectrics over, and in direct contact with, the source/drain region epitaxial material in the diode active area/Region I, and FIG. 34B is an X cross-sectional view illustrating the second interlayer dielectric having been deposited onto the first interlayer dielectric in both the diode active area/Region I and the logic/SRAM active area/Region II, and (first and second) source/drain contacts having been formed in the first and second interlayer dielectrics over, and in direct contact with, the source/drain region epitaxial material in the diode active area/Region I and the logic/SRAM active area/Region II, respectively, according to an embodiment of the present invention;

DETAILED DESCRIPTION OF PREFERRED EMBODIMENTS

Provided herein are techniques for co-integrating gate-all-around nanosheet logic/static random access memory (SRAM) devices having bottom dielectric isolation with an ideal vertical P-N-P diode on a common substrate. As will be described in detail below, the present techniques involve forming a nanosheet stack on the (common) substrate, and then removing the nanosheet stack from the diode region, using fin recess post bottom dielectric isolation formation. Steps are then taken to implant the diode region selective to the nanosheet logic/SRAM devices. Optionally, embodiments are contemplated herein where the diode region is supported by gates. Embodiments are also contemplated herein where a bottom dielectric isolation ring is formed around the perimeter of the diode region which serves to define edge placement and prevents surface degradation.

Figure 1:
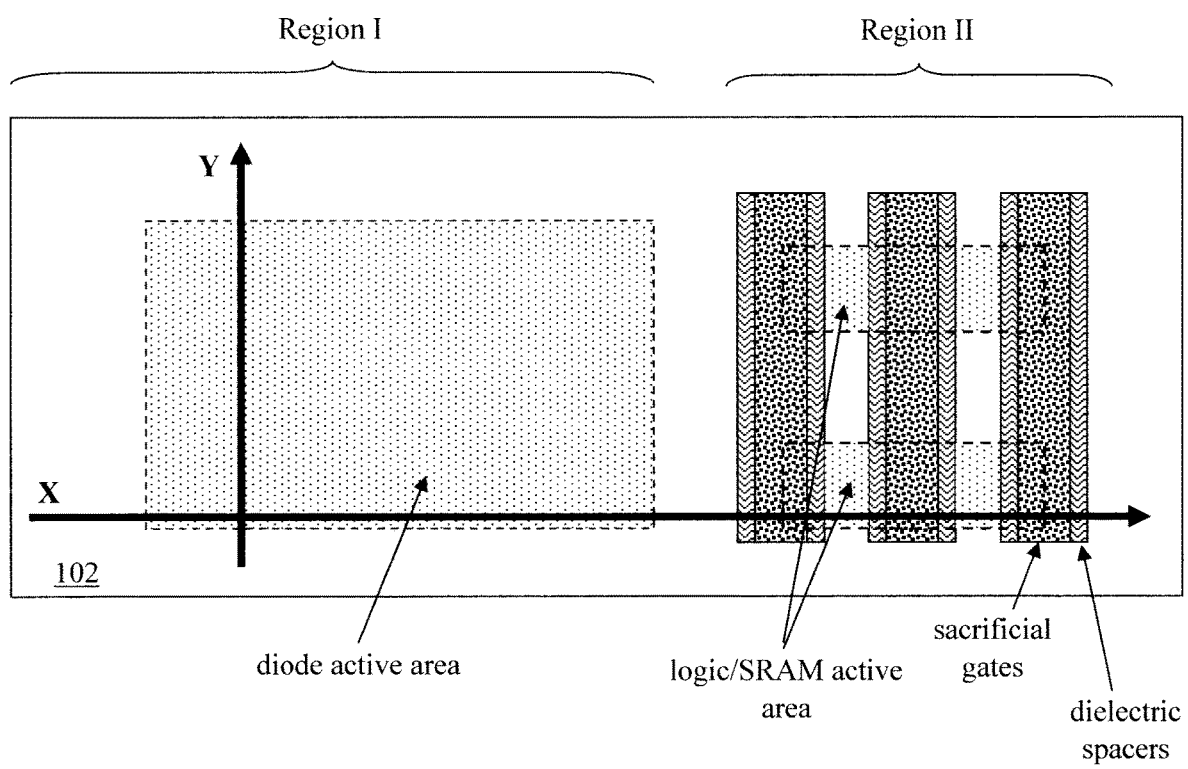
FIG. 1 is a top-down diagram illustrating a layout of the present integrated nanosheet/diode device on a substrate and an orientation of the X and Y cross-sectional views shown in the figures according to an embodiment of the present invention.

Given the above overview, an exemplary methodology for fabricating a semiconductor structure having an integrated nanosheet gate-all-around nanosheet logic/SRAM device with bottom dielectric isolation and an ideal vertical P-N-P diode on a common substrate in accordance with the present techniques is now described by way of reference to FIGS. 1-19. Referring to FIG. 1, a top-down diagram, the present process flow will involve the formation of an ideal vertical P-N-P diode in a first region (Region I) of a substrate 102 (see diode active area), and a gate-all-around nanosheet logic/SRAM device in a second region (Region II) of the substrate 102 (see logic/SRAM active area). For ease and clarity of description, the fabrication of a single ideal vertical P-N-P diode and nanosheet logic/SRAM device is depicted in the figures. However, it is to be understood that multiple integrated nanosheet/diode devices can be produced on a common substrate in the same manner as described herein.

As will be described in detail below, the present embodiments employ a gate-last approach. With a gate-last approach, sacrificial gates are used as a placeholder during formation of the source/drain regions. The term "sacrificial" as used herein refers to a material or structure that is used in one part of the process, and then later removed, in whole or in part, during fabrication of the integrated nanosheet/diode device. In that manner, the sacrificial gates are removed later on in the process, and replaced with the final gates of the device (also referred to herein as "replacement gates"). When the replacement gates are metal gates, they may also be referred to herein as "replacement metal gates." Thus, the positioning of the sacrificial gates also denotes the positioning of the replacement gates that will be placed later on. Advantageously, use of a gate-last process avoids exposing the replacement gate materials such as high-κ dielectrics to potentially damaging conditions such as the high temperatures experienced during source/drain region formation.

FIG. 1 also illustrates an orientation of the X and Y cross-sectional views that will be shown in the figures. Namely, as shown in FIG. 1, the X cross-sectional views depict cuts through Region I of substrate 102, the diode active area, and through Region II of substrate 102, the logic/SRAM active area. The Y cross-sectional views depict cuts, through Region I of substrate 102, the diode active area, perpendicular to the X cross-sectional views. It is notable that the structures shown throughout the figures may not be drawn to scale.

Referring to FIG. 2A (a Y cross-sectional view) and FIG. 2B (an X cross-sectional view), the process begins with the formation of a Psub implant 204 and an Nwell implant 206 in the substrate 102. According to one exemplary embodiment, substrate 102 is a bulk semiconductor wafer, such as a bulk silicon (Si) wafer, a bulk germanium (Ge) wafer or a bulk silicon germanium (SiGe) wafer.

Ion implantation techniques are implemented to form the Psub implant 204 and an Nwell implant 206 in substrate 102. For instance, in one exemplary embodiment, Psub implant 204 is formed by implanting a p-type dopant(s) to a depth of from about 250 nanometers (nm) to about 300 nm in substrate 102, with an implant energy of about 100 kiloelectron-volts (keV). Suitable p-type dopants include, but are not limited to, boron (B). Nwell implant 206 is then formed in substrate 102 over the Psub implant 204. For instance, in an exemplary embodiment, Nwell implant 206 is formed by implanting an n-type dopant(s) to a depth of from about 30 nm to about 170 nm in substrate 102, with a tri-implant having an implant energy of from about 20 keV to about 120 keV. Suitable n-type dopants include, but are not limited to, phosphorous (P) and/or arsenic (As). A tri-implant is a common technique used to make sure that a well dopant is relatively evenly distributed above the substrate dopant.

As highlighted above, a nanosheet stack 302 is then formed on the substrate 102 in both Region I (the diode active area) and Region II (the logic/SRAM active area). See FIG. 3A (a Y cross-sectional view) and FIG. 3B (an X cross-sectional view). Later on, the nanosheet stack will be removed from the diode region post bottom dielectric isolation formation.

Nanosheet stack 302 includes alternating sacrificial and active nanosheets oriented horizontally one on top of another on substrate 102. Specifically, as shown in FIGS. 3A and 3B, nanosheet stack 302 includes a (first) sacrificial nanosheet 304 deposited on the substrate 102, and alternating layers of (second) sacrificial nanosheets 306a,b,c, etc. and active nanosheets 308a,b,c,etc. deposited on sacrificial nanosheet 304.

As will be described in detail below, the sacrificial nanosheets 306a,b,c,etc. will be removed later on in the process to permit the formation of a gate-all-around configuration for the nanosheet logic/SRAM device. By contrast, active nanosheets 308a,b,c,etc. will remain in place and serve as channels of the nanosheet logic/SRAM device. It is notable that the number of sacrificial nanosheets 306a,b,c,etc. and active nanosheets 308a,b,c,etc. shown in the figures is provided merely as an example to illustrate the present techniques. For instance, embodiments are contemplated herein where more or fewer sacrificial nanosheets 306a,b,c,etc. and/or more or fewer active nanosheets 308a,b,c,etc. are present than shown.

According to an exemplary embodiment, the sacrificial nanosheet 304 and each of the sacrificial nanosheets 306a,b,c,etc./active nanosheets 308a,b,c,etc. are deposited/formed on the substrate 102 using an epitaxial growth process. In one exemplary embodiment, the sacrificial nanosheet 304 and the sacrificial nanosheets 306a,b,c,etc./active nanosheets 308a,b,c,etc. each have a thickness of from about 6 nm to about 25 nm.

The materials employed for sacrificial nanosheets 306a,b,c,etc. and active nanosheets 308a,b,c,etc. are such that the sacrificial nanosheets 306a,b,c,etc. can be removed selective to the active nanosheets 308a,b,c,etc. during fabrication. Further, as will be described in detail below, the material employed for sacrificial nanosheet 304 needs to be such that sacrificial nanosheet 304 can be removed selective to sacrificial nanosheets 306a,b,c,etc. during fabrication in order to form the bottom dielectric isolation. As provided above, bottom dielectric isolation advantageously serves to prevent source-to-drain leakage via the substrate 102.

For instance, according to one exemplary embodiment, sacrificial nanosheet 304 and sacrificial nanosheets 306a,b,c,etc. are each formed from SiGe, while active nanosheets 308a,b,c,etc. are formed from Si. In that case, etchants such as wet hot SC1, vapor phase hydrogen chloride (HCl), vapor phase chlorine trifluoride ($ClF_3$) and other reactive clean processes (RCP) are selective for etching of SiGe versus Si.

Further, high germanium (Ge) content SiGe can be removed selective to low Ge content SiGe using an etchant such as dry HCl. Thus, according to an exemplary embodiment, sacrificial nanosheet 304 is formed from SiGe having a high Ge content. For instance, in one exemplary embodiment, high Ge content SiGe is SiGe having from about 45% Ge to about 70% Ge. For instance, in one non-limiting example, sacrificial nanosheet 304 is formed from SiGe60 (which is SiGe having a Ge content of about 60%). Use of a higher Ge content SiGe will enable the sacrificial nanosheet 304 to be etched selective to sacrificial nanosheets 306a,b,c,etc. when forming the bottom dielectric isolation (see below). In that case, sacrificial nanosheets 306a,b,c,etc. are preferably formed from a low Ge content SiGe. For instance, in one exemplary embodiment, low Ge content SiGe is SiGe having from about 15% Ge to about 35% Ge. For example, in one non-limiting embodiment, sacrificial nanosheets 306a,b,c,etc. are formed from SiGe25 (which is SiGe having a Ge content of about 25%).

As shown in FIG. 4A (a Y cross-sectional view) and FIG. 4B (an X cross-sectional view), the sacrificial nanosheet 304, sacrificial nanosheets 306a,b,c,etc. and active nanosheets 308a,b,c,etc. of nanosheet stack 302 are next patterned into individual stacks 402 and 404 over (first/second) Region I (the diode active area) and Region II (the logic/SRAM active area) of substrate 102, respectively, shallow trench isolation regions 406 are then formed in the substrate 102 between the stacks 402 and 404, and a sacrificial gate oxide 408 is formed on a top and along sidewalls of the stacks 402 and 404.

Standard lithography and etching techniques can be employed to pattern the stacks 402 and 404. With standard lithography and etching techniques, a lithographic stack (not shown), e.g., photoresist/anti-reflective coating/organic planarizing layer, is used to pattern a hardmask (not shown) with the footprint and location of each of the individual stacks 402 and 404. An etch is then performed to transfer the pattern from the hardmask to the underlying nanosheet stack 302 of sacrificial nanosheets 304/306a,b,c,etc. and active nanosheets 308a,b,c,etc. Suitable etching processes include, but are not limited to, directional (anisotropic) etching processes such as reactive ion etching.

According to an exemplary embodiment, the etch used to pattern the stacks 402 and 404 extends beyond nanosheet stack 302, resulting in the patterning of trenches in the substrate 102 between the stacks 402 and 404. For clarity, a dashed outline is used in FIG. 4B to illustrate one of these trenches, with the understanding that a trench is present at the location of each shallow trench isolation region 406. Namely, the shallow trench isolation regions 406 are then formed in the trenches between the stacks 402 and 404. Shallow trench isolation regions 406 serve to isolate the stacks 402 and 404. To form the shallow trench isolation regions 406, a dielectric such as an oxide (which may also be generally referred to herein as a 'shallow trench isolation oxide') is deposited into, and filling, the trenches, followed by planarization and recess. Although not explicitly shown in the figures, a liner (e.g., a thermal oxide or silicon nitride (SiN)) may be deposited into the trenches prior to the shallow trench isolation oxide. Suitable shallow trench isolation oxides include, but are not limited to, oxide low-κ materials such as silicon oxide (SiOx) and/or oxide ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be employed to deposit the shallow trench isolation oxide, after which the shallow trench isolation oxide can be planarized using a process such as chemical mechanical polishing. After that, the shallow trench isolation oxide is recessed using a dry or wet etch process to form the shallow trench isolation regions 406 at a base of the stacks 402 and 404.

Suitable materials for the sacrificial gate oxide 408 include, but are not limited to, silicon oxide (SiOx), which can be deposited onto top and along sidewalls of the stacks 402 and 404 using a process such as CVD, ALD or PVD. According to an exemplary embodiment, the sacrificial gate oxide 408 has a thickness of from about 1 nm to about 3 nm.

Figures 5A, 5B:
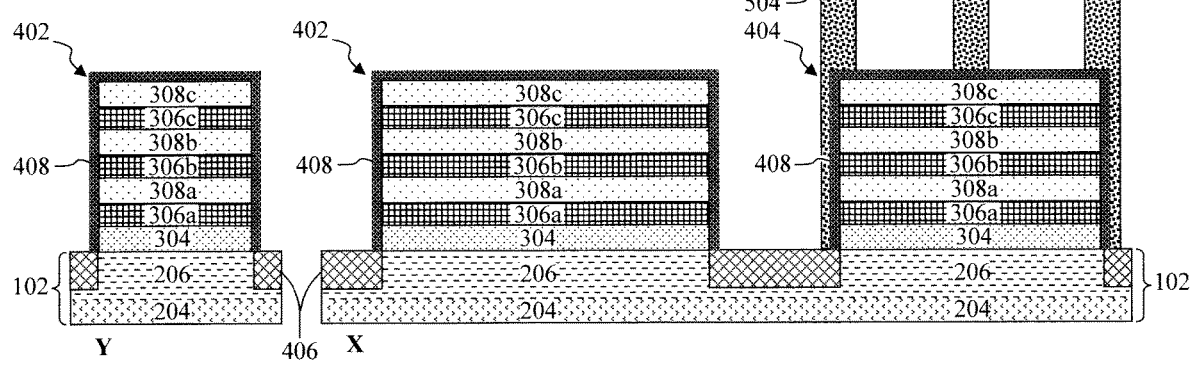
FIG. 5A is a Y cross-sectional view illustrating sacrificial gate hardmasks having been used to form sacrificial gates only on the second stack in Region II (the logic/SRAM active area) of the substrate.
FIG. 5B is an X cross-sectional view illustrating the sacrificial gates having been formed only on the second stack in Region II (the logic/SRAM active area) of the substrate according to an embodiment of the present invention.

As shown in FIG. 5A (a Y cross-sectional view) and FIG. 5B (an X cross-sectional view), sacrificial gates 504 are formed only on the stack 404 in Region II (the logic/SRAM active area) of substrate 102. To do so, blanket deposition of a sacrificial gate material is followed by an etch that completely removes the sacrificial gate material from Region I (the diode active area) of substrate 102.

Suitable sacrificial gate materials include, but are not limited to, poly-silicon and/or amorphous silicon. A process such as CVD, ALD or PVD can be employed to deposit the sacrificial gate material over both of the stacks 402 and 404. Sacrificial gate hardmasks 502 are then formed on the sacrificial gate material marking the footprint and location of each of the sacrificial gates 504 over the stack 404 in Region II (the logic/SRAM active area) of substrate 102. Suitable hardmask materials include, but are not limited to, silicon nitride (SiN), silicon dioxide (SiO$_2$), titanium nitride (TiN) and/or silicon oxynitride (SiON). An etch using the sacrificial gate hardmasks 502 is then used to pattern the sacrificial gate material into the individual sacrificial gates 504 shown in FIG. 5B over the stack 404 in Region II (the logic/SRAM active area) of substrate 102. As shown in FIG. 5A, during this etch the sacrificial gate material is completely removed from Region I (the diode active area) of the substrate 102.

Figures 6A, 6B:
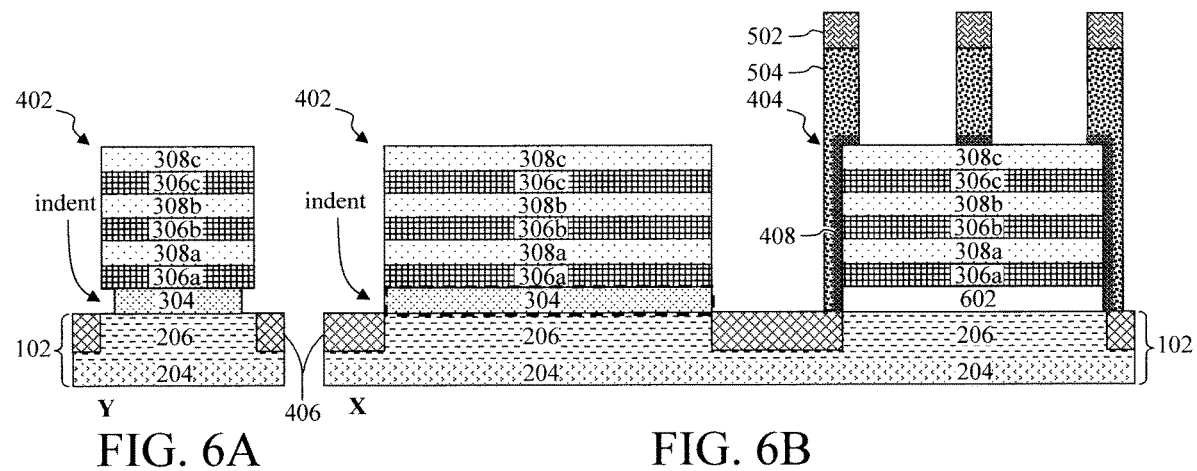
FIG. 6A is a Y cross-sectional view illustrating the exposed sacrificial gate oxide having been removed, and a selective etch having been performed to partially remove the first sacrificial nanosheet from the first stack over Region I (the diode active area) of the substrate.
FIG. 6B is an X cross-sectional view illustrating the exposed sacrificial gate oxide having been removed, and the selective etch having been performed to fully remove the first sacrificial nanosheet from the second stack over Region II (the logic/SRAM active area) of the substrate forming a cavity for bottom dielectric isolation according to an embodiment of the present invention.

As shown in FIG. 6A (a Y cross-sectional view) and FIG. 6B (an X cross-sectional view), following patterning of the sacrificial gates 504 the exposed sacrificial gate oxide 408 is removed, and a selective etch is performed to fully remove the sacrificial nanosheet 304 from stack 404 in Region II (the logic/SRAM active area) of substrate 102 for bottom dielectric isolation formation. As shown in FIGS. 6A and 6B, due to the larger footprint of the diode active area versus the logic/SRAM active area (as illustrated, for example, in FIG. 1), the etch to fully remove the sacrificial nanosheet 304 from stack 404 in Region II (the logic/SRAM active area) of substrate 102, only partially removes (i.e., indents the exposed outer edges of) the sacrificial nanosheet 304 in Region I (the diode active area) of substrate 102.

An oxide-selective etching process can be employed to remove the sacrificial gate oxide 408 exposed along the top and sidewalls of stack 402 in Region I (the diode active area) of the substrate 102, and along the top of stack 404 between the sacrificial gates 504 in Region II (the logic/SRAM active area) of substrate 102. As shown in FIG. 6B, the sacrificial gate oxide 408 masked by the sacrificial gates 504 remains.

As provided above, the sacrificial nanosheet 304 can be formed from SiGe having a high Ge content (such as SiGe60), whereas the sacrificial nanosheets 306*a,b,c*,etc. can be formed from low Ge content SiGe (such as SiGe25). In that case, the sacrificial nanosheet 304 can be selectively removed using an etchant such as dry HCl. The full removal of sacrificial nanosheet 304 forms a cavity 602 in stack 404, whereas indents are formed in the sacrificial nanosheet 304 at the base of stack 402. In FIG. 6B, this indenting of sacrificial nanosheet 304 is indicated using a dashed outline. Namely, in the X cross-sectional view, the indent in the sacrificial nanosheet 304 would be into the page.

Figure 7:
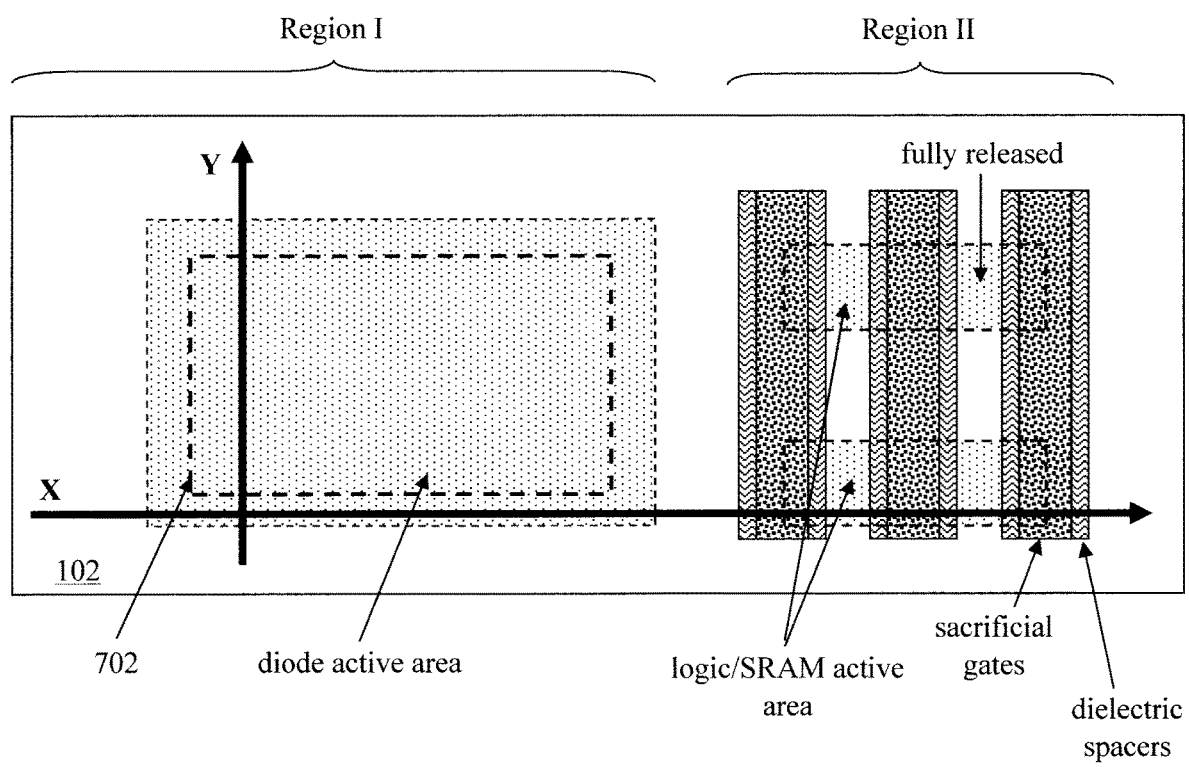
FIG. 7 is a top-down diagram illustrating how the removal of the first sacrificial nanosheet for bottom dielectric isolation formation only reaches a portion of the first stack in Region I (the diode active area), while the sacrificial nanosheet is fully removed from the second stack in Region II (the logic/SRAM active area) according to an embodiment of the present invention.

FIG. 7 is a top-down diagram illustrating how removal of the sacrificial nanosheet 304 for bottom dielectric isolation formation only reaches a portion of stack 402 in Region I (the diode active area) in from a perimeter of the sacrificial nanosheet 304, while the sacrificial nanosheet 304 from stack 404 in Region II (the logic/SRAM active area) of substrate 102 is fully removed. Namely, as indicated by dashed line 702 in FIG. 7, the bottom dielectric isolation only reaches about 100 nm into the diode active area (Region I) from the outer edges. By contrast, the sacrificial nanosheet 304 is fully released for bottom dielectric isolation formation in the logic/SRAM active area (Region II).

Figures 8A, 8B:
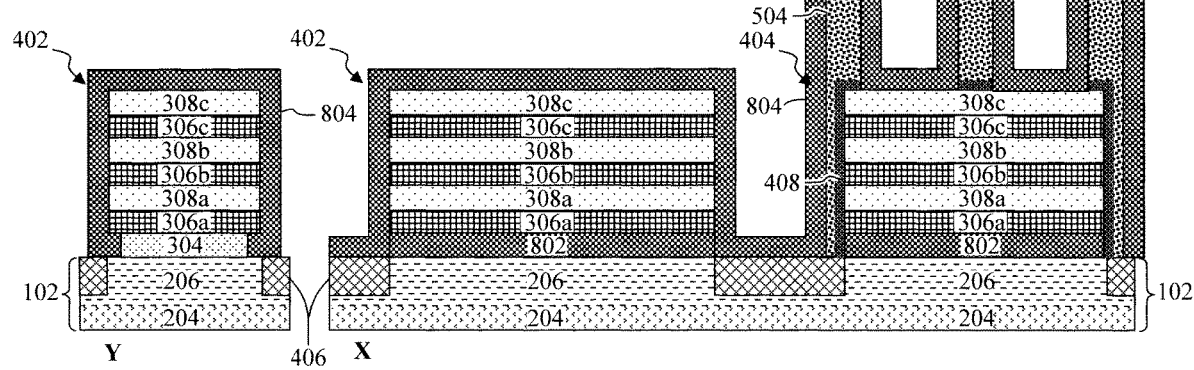
FIG. 8A is a Y cross-sectional view illustrating dielectric spacers having been formed along the top and sidewalls of the first stack in the diode active area/Region I.
FIG. 8B is an X cross-sectional view illustrating a bottom dielectric isolation layer having been formed in the cavity in the second stack and dielectric spacers having been formed alongside the sacrificial gate hardmasks and sacrificial gates (in the logic/SRAM active area/Region II), and along the top and sidewalls of the first stack in the diode active area/Region I according to an embodiment of the present invention.

As shown in FIG. 8A (a Y cross-sectional view) and FIG. 8B (an X cross-sectional view), a dielectric spacer material is then deposited over the stacks 402/404 and into/filling the cavity 602 (in the logic/SRAM active area/Region II) and indents (in the diode active area/Region I), followed by a directional (anisotropic) etching process such as reactive ion etching to pattern the dielectric spacer material into a bottom dielectric isolation layer 802 in the cavity 602 and dielectric spacers 804 alongside the sacrificial gate hardmasks 502 and sacrificial gates 504 (in the logic/SRAM active area/Region II), and along the top and sidewalls of the stack 402 (in the diode active area/Region I). Suitable dielectric spacer materials include, but are not limited to, SiOx, silicon carbide (SiC), silicon oxycarbide (SiCO) and/or SiN. A process such as CVD, ALD or PVD can be employed to deposit the dielectric spacer material. As highlighted above, the bottom dielectric isolation layer 802 is used to prevent source-to-drain leakage via the substrate 102. The bottom dielectric isolation layer 802 is visible in FIG. 8B at the bottom of stack 402 (in the diode active area/Region I). It is notable, however, that the bottom dielectric isolation layer 802 only fills the indents in the sacrificial nanosheet 304 of stack 402. Thus, the bottom dielectric isolation layer 802 in stack 402 is thinner than it is in stack 404 (in the logic/SRAM active area/Region II).

Figures 9A, 9B:
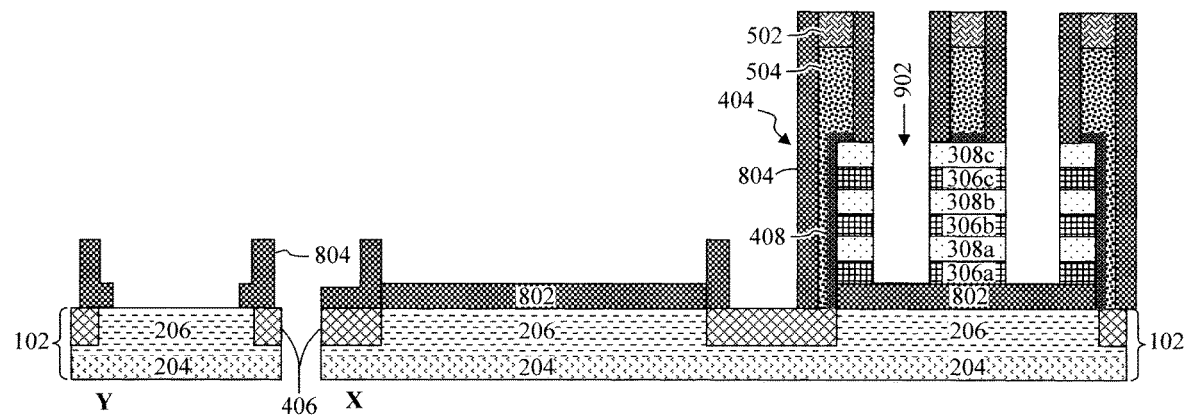
FIG. 9A is a Y cross-sectional view illustrating the dielectric spacers having been recessed and the underlying first stack in the diode active area/Region I having been removed.
FIG. 9B is an X cross-sectional view illustrating the dielectric spacers having been recessed, the underlying first stack in the diode active area/Region I having been removed, and trenches having been patterned in the logic/SRAM active area/Region II stack according to an embodiment of the present invention.

As shown in FIG. 9A (a Y cross-sectional view) and FIG. 9B (an X cross-sectional view), the dielectric spacers 804 are recessed to expose the underlying stacks 402 and 404 in the diode active area/Region I and the logic/SRAM active area/Region II, respectively, which are then patterned to fully remove the stack 402 from the diode active area/Region I.

A directional (anisotropic) etching processes such as reactive ion etching can be used to recess the dielectric spacers 804 which removes the dielectric spacers 804 from all horizontal surfaces, including along the top of the stack 402 (in the diode active area/Region I), and along the top of the stack 404 (in the logic/SRAM active area/Region II) between the sacrificial gate hardmasks 502/sacrificial gates 504. The sacrificial gate hardmasks 502/sacrificial gates 504 and remaining dielectric spacers 804 (see FIG. 9B) are then used as a mask to pattern trenches 902 in the stack 404 (in the logic/SRAM active area/Region II) in between the sacrificial gates 504. A directional (anisotropic) etching process such as reactive ion etching can be employed for the trench etch. As shown in FIG. 9B, trenches 902 extend through each of the sacrificial nanosheets 306a,b,c,etc. and active nanosheets 308a,b,c,etc. in stack 404 (in the logic/SRAM active area/Region II), stopping on the bottom dielectric isolation layer 802. Without any mask in place over the stack 402 (in the diode active area/Region I), stack 402 is fully removed during this trench etch.

As shown in FIG. 10A (a Y cross-sectional view) and FIG. 10B (an X cross-sectional view), inner spacers 1002 are formed alongside the sacrificial nanosheets 306a,b,c,etc. in stack 404 (in the logic/SRAM active area/Region II). To form the inner spacers 1002, a selective lateral etch is performed to recess the sacrificial nanosheets 306a,b,c,etc. exposed along the sidewalls of trenches 902. This recess etch forms pockets along the sidewalls of the trenches 902 that are then filled with a spacer material to form the inner spacers 1002 within the pockets. These inner spacers 1002 will offset the replacement gates from the source/drain regions (see below). As provided above, the sacrificial nanosheets 306a,b,c,etc. can be formed from SiGe. In that case, a SiGe-selective non-directional (isotropic) etching process can be used for the recess etch. Suitable spacer materials for inner spacers 1002 include, but are not limited to, silicon SiN, SiOx, SiC and/or SiCO. A process such as CVD, ALD or PVD can be employed to deposit the spacer material into the pockets, after which excess spacer material can be removed from the trenches 902 using a non-directional (isotropic) etching process.

As shown in FIG. 11A (a Y cross-sectional view) and FIG. 11B (an X cross-sectional view), a block mask 1102 is formed over/masking the stack 404 (in the logic/SRAM active area/Region II), and an etch is then used to remove what remains of the bottom dielectric isolation layer 802 and dielectric spacers 804 from the diode active area/Region I. It is notable that this step of removing the remnants of the bottom dielectric isolation layer 802 and dielectric spacers 804 from the diode active area/Region I is optional, and embodiments are contemplated herein (see below) where they are kept in place. Namely, the remnants of the bottom dielectric isolation layer 802 and dielectric spacers 804 may be kept in the diode active area/Region I for edge placement and confinement of the source/drain region epitaxy, thereby minimizing edge effects due to the epitaxy crossing over from the Nwell implant 206 region to the shallow trench isolation regions 406. Alternatively, remnants of the bottom dielectric isolation layer 802 and dielectric spacers 804 in the diode active area/Region I can be removed in order to be compatible with the formation of electrostatic discharge diodes, which are formed by patterning/opening large canyon devices for bottom dielectric isolation break through before source/drain region epitaxy growth from the substrate.

To form the block mask 1102, a masking material is first blanket deposited onto the substrate 102 over the stack 404 in the logic/SRAM active area/Region II and the remnants of the bottom dielectric isolation layer 802 and dielectric spacers 804 in the diode active area/Region I. Standard lithography and etching techniques (see above) are then used to pattern the masking material into the block mask 1102 shown in FIG. 11B. Suitable masking materials include, but are not limited to, organic planarizing layer materials, which can be deposited onto the substrate 102 using a casting process such as spin-casting or spray coating.

Block mask 1102 protects the stack 404 in the logic/SRAM active area/Region II during the (optional) removal of the remnants of the bottom dielectric isolation layer 802 and dielectric spacers 804 in the diode active area/Region I. As provided above, the bottom dielectric isolation layer 802 and dielectric spacers 804 can be formed from materials such as SiOx, SiC, SiCO and/or SiN. In that case, an oxide- or nitride-selective etching process can be employed to remove what remains of the bottom dielectric isolation layer 802 and dielectric spacers 804 in the diode active area/Region I.

Following removal of the remnants of the bottom dielectric isolation layer 802 and dielectric spacers 804 in the diode active area/Region I, the block mask 1102 is removed. As provided above, block mask 1102 can be formed from an organic planarizing material. In that case, a process such as ashing can be employed to remove the block mask 1102.

As shown in FIG. 12A (a Y cross-sectional view) and FIG. 12B (an X cross-sectional view), an implant mask 1202 is formed over/masking the stack 404 (in the logic/SRAM active area/Region II), and a P+ implant 1204 is formed in the diode active area/Region I of substrate 102 over the Nwell implant 206 (see arrows 1206). To form the implant mask 1202, an implant masking material is first blanket deposited onto the substrate 102 in the logic/SRAM active area/Region II (over the stack 404) and in the diode active area/Region I. Standard lithography and etching techniques (see above) are then used to pattern the implant masking material into the implant mask 1202 shown in FIG. 12B. Suitable implant masking materials include, but are not limited to, organic planarizing layer materials, which can be deposited onto the substrate 102 using a casting process such as spin-casting or spray coating.

Ion implantation techniques are implemented to form the P+ implant 1204 in substrate 102. For instance, in an exemplary embodiment, P+ implant 1204 is formed by implanting a p-type dopant(s) to a shallow depth of from about 0 nm to about 75 nm in substrate 102 to ensure about 100 nm of Nwell implant 206 remains between the P+ implant 1204 and the underlying Psub implant 204. As provided above, suitable p-type dopants include, but are not limited to, boron (B).

Advantageously, integrating the vertical P-N-P structure for the diode in this manner facilitates formation and preservation of all of the implant layers. Namely, if a P+ implant was done prior to nanosheet recess, that P+ region would be removed. However, by forming the P+ implant 1204 at this point in the process flow, its existence is guaranteed, and immediately contacted/preserved by the source/drain region epitaxy grown immediately above it (see below). Further, P+ implants for other purposes such as guard rings, electrostatic discharge diodes, etc. are also done at this same point in the integration, so various implant doses, energies, types, etc. can all be done back-to-back using different masks for different locations/functions.

Following formation of the P+ implant 1204 in the diode active area/Region I of substrate 102, the implant mask 1202 is removed. As provided above, implant mask 1202 can be formed from an organic planarizing material. In that case, a process such as ashing can be employed to remove the implant mask 1202.

As shown in FIG. 13A (a Y cross-sectional view) and FIG. 13B (an X cross-sectional view), a source/drain region epitaxial material 1302 is grown concurrently both on the substrate 102 over the Psub implant 204/Nwell implant 206/P+ implant 1204 in the diode active area/Region I, and in the trenches 902 on opposite sides of the sacrificial gates 504 in the logic/SRAM active area/Region II to form source/drain regions of the nanosheet logic/SRAM device. According to an exemplary embodiment, the source/drain region epitaxial material 1302 is a p-type in-situ doped (i.e., during growth) or ex-situ doped (e.g., via ion implantation) epitaxial material such as epitaxial Si, epitaxial SiGe, etc. As provided above, suitable p-type dopants include, but are not limited to, boron (B). With inner spacers 1002 in place along the sidewalls of trenches 902, epitaxial growth of the source/drain regions of the nanosheet logic/SRAM device is templated only from the ends of the active nanosheets 308a,b,c,etc. in stack 404 along the sidewalls of trenches 902.

According to an exemplary embodiment, the source/drain region epitaxial material 1302 grown in the diode active area/Region I has a width W of from about 2 micrometer (μm) to about 5 μm, and a length L of from about 3 μm to about 10 μm. See FIGS. 13A and 13B. Having width W and length L dimensions on the order of multiple micrometers serves to minimize perimeter effects as compared to bulk area effects for the diode. As shown in FIGS. 13A and 13B, a height H of the source/drain region epitaxial material 1302 grown in the diode active area/Region I can vary. However, the epitaxial material 1302 has to be continuous across all of the diode connections, see below.

As shown in FIG. 14A (a Y cross-sectional view) and FIG. 14B (an X cross-sectional view), a contact etch stop liner 1402 is deposited onto the device structure over the source/drain region epitaxial material 1302 in both the diode active area/Region I and the logic/SRAM active area/Region II, followed by an interlayer dielectric 1404. Suitable materials for the contact etch stop liner 1402 include, but are not limited to, silicon borocarbonitride (SiBCN), silicon oxycarbide (SiCO) and/or SiN, which can be deposited using a process such as CVD, ALD or PVD. According to an exemplary embodiment, contact etch stop liner 1402 has a thickness of from about 1 nm to about 3 nm.

Suitable interlayer dielectric 1404 materials include, but are not limited to, oxide low-K materials such as SiOx and/or oxide ULK-ILD materials such as pSiCOH, which can be deposited onto the contact etch stop liner 1402 using a process such as CVD, ALD, or PVD can be employed to deposit the interlayer dielectric 1404, after which the interlayer dielectric 1404 can be planarized using a process such as chemical mechanical polishing.

As shown in FIG. 15A (a Y cross-sectional view) and FIG. 15B (an X cross-sectional view), the sacrificial gate hardmasks 502, the sacrificial gates 504, and sacrificial gate oxide 408 are then removed relative to the dielectric spacers 804 and inner spacers 1002 using an etch selective for the sacrificial gate hardmask, gate, and gate oxide materials (see above). Removal of the sacrificial gate hardmasks 502, sacrificial gates 504 and sacrificial gate oxide 408 forms gate trenches 1502 in the interlayer dielectric 1404 over the stack 404 (in the logic/SRAM active area/Region II) between the source/drain regions of the nanosheet device. As shown in FIG. 15B, the sacrificial nanosheets 306a,b,c,etc. of stack 404 (in the logic/SRAM active area/Region II), now accessible through the gate trenches 1502, are then selectively removed. Removal of the sacrificial nanosheets 306a,b,c, etc., releases the active nanosheets 308a,b,c,etc. from the stack 404 in a channel region of the nanosheet device.

Gaps are now present in the stack 404 in between the active nanosheets 308a,b,c,etc. Active nanosheets 308a,b,c, etc. form the channels of the nanosheet device. As shown in FIG. 16A (a Y cross-sectional view) and FIG. 16B (an X cross-sectional view), replacement gates 1602 are next formed in the gate trenches 1502 and the gaps that fully surround a portion of each of the active nanosheets 308a, b,c,etc. in a gate-all-around configuration, and dielectric caps 1604 are formed in the gate trenches 1502 over the replacement gates 1602. The replacement gates may also be referred to herein simply as 'gates.'

Referring to magnified view 1600 in FIG. 16B, according to an exemplary embodiment, formation of the replacement gates 1602 begins with the deposition of a (conformal) gate dielectric 1606 into and lining each of the gate trenches 1502 and gaps with the gate dielectric 1606 being disposed on the active nanosheets 308a,b,c,etc. in the channel region of the nanosheet device (in the logic/SRAM active area/Region II). According to an exemplary embodiment, gate dielectric 1606 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, hafnium oxide ($HfO_2$) and/or lanthanum oxide ($La_2O_3$). A process such as CVD, ALD or PVD can be employed to deposit the gate dielectric 1606. According to an exemplary embodiment, gate dielectric 1606 has a thickness of from about 1 nm to about 5 nm and ranges therebetween. A reliability anneal can be performed following deposition of gate dielectric 1606. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as, but not limited to, nitrogen.

At least one workfunction-setting metal 1608 is then deposited into the gate trenches 1502 and gaps over the gate dielectric 1606. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal(s) 1608, after which the metal overburden can be removed using a process such as chemical mechanical polishing.

Optionally, a (low-resistance) fill metal 1610 can be deposited into the gate trenches 1502 and gaps over the workfunction-setting metal(s) 1608 so as to fill in any remaining spaces in the replacement gates 1602. Suitable low-resistance fill metals 1610 include, but are not limited to, W, cobalt (Co), ruthenium (Ru) and/or Al, which can be deposited using a process or combination of processes including, but not limited to, CVD, ALD, PVD, sputtering, plating, evaporation, ion beam deposition, electron beam deposition, laser assisted deposition, chemical solution deposition, etc.

The replacement gates 1602 are then recessed, and dielectric caps 1604 are formed in the gate trenches 1502 over the (recessed) replacement gates 1602. Suitable materials for dielectric caps 1604 include, but are not limited to, SiOx and/or SiN. A process such as CVD, ALD or PVD can be employed to deposit the dielectric cap material into the gate trenches 1502, after which the material can be planarized using a process such as chemical mechanical polishing. Now present is a nanosheet device structure in the logic/SRAM active area/Region II that includes at least one gate (i.e., replacement gates 1602 having gate dielectric 1606/workfunction-setting metal(s) 1608/optional fill metal 1610) with source/drains regions of the nanosheet device on opposite sides of the at least one gate, and channels of the nanosheet device (i.e., active nanosheets 308a,b,c,etc.) interconnecting the source/drains regions. Dielectric caps 1604 will protect the underlying replacement gates 1602 during source/drain contact formation (see below).

As shown in FIG. 17A (a Y cross-sectional view) and FIG. 17B (an X cross-sectional view), an interlayer dielectric 1702 is deposited onto the interlayer dielectric 1404 in both the diode active area/Region I and the logic/SRAM active area/Region II, and (first and second) source/drain contacts 1704 and 1706 are formed in the interlayer dielectrics 1404 and 1702 over, and in direct contact with, the source/drain region epitaxial material 1302 in the diode active area/Region I and the logic/SRAM active area/Region II, respectively. For clarity, the terms 'first' and 'second' may also be used herein when referring to interlayer dielectric 1404 and interlayer dielectric 1702, respectively.

Suitable interlayer dielectric 1702 materials include, but are not limited to, SiN, SiOC and/or oxide low-K materials such as SiOx and/or oxide ULK-ILD materials such as pSiCOH, which can be deposited using a process such as CVD, ALD or PVD. Following deposition, the interlayer dielectric 1702 can be planarized using a process such as chemical mechanical polishing.

To form the source/drain contacts 1704 and 1706, a standard lithography and etching process (see above) is employed to pattern trenches in interlayer dielectrics 1404/1702 and contact etch stop liner 1402 (which serves as an etch stop for the bulk dielectric etch), which are then filled with a metal or combination of metals. Suitable metals for the source/drain contacts 1704 and 1706 include, but are not limited to, W, Ru and/or Co, which can be deposited into the trenches using a process such as evaporation, sputtering, ALD, CVD or electrochemical plating. Following deposition, the metal overburden can be removed using a process such as chemical-mechanical polishing. Prior to depositing the metal(s), an adhesion layer (not shown) can be formed lining the trenches. Suitable adhesion layer materials include, but are not limited to, titanium nitride (TiN) and/or tantalum nitride (TaN). Additionally, a seed layer (not shown) can also be deposited into and lining the trenches prior to metal deposition, e.g., to facilitate plating of the metal.

As shown in FIGS. 17A and 17B, multiple source/drain contacts 1704 are formed contacting the source/drain region epitaxial material 1302 in the diode active area/Region I. As provided above, the height of the source/drain region epitaxial material 1302 in the diode active area/Region I can vary. Notwithstanding, as shown in FIGS. 17A and 17B, the (single) epitaxial material 1302 is continuous across all of the source/drain contacts 1704. As shown in FIG. 17B, source/drain contacts 1706 directly contact the source/drain region epitaxial material 1302 in the logic/SRAM active area/Region II, i.e., the source/drains regions of the nanosheet device.

Figure 18:
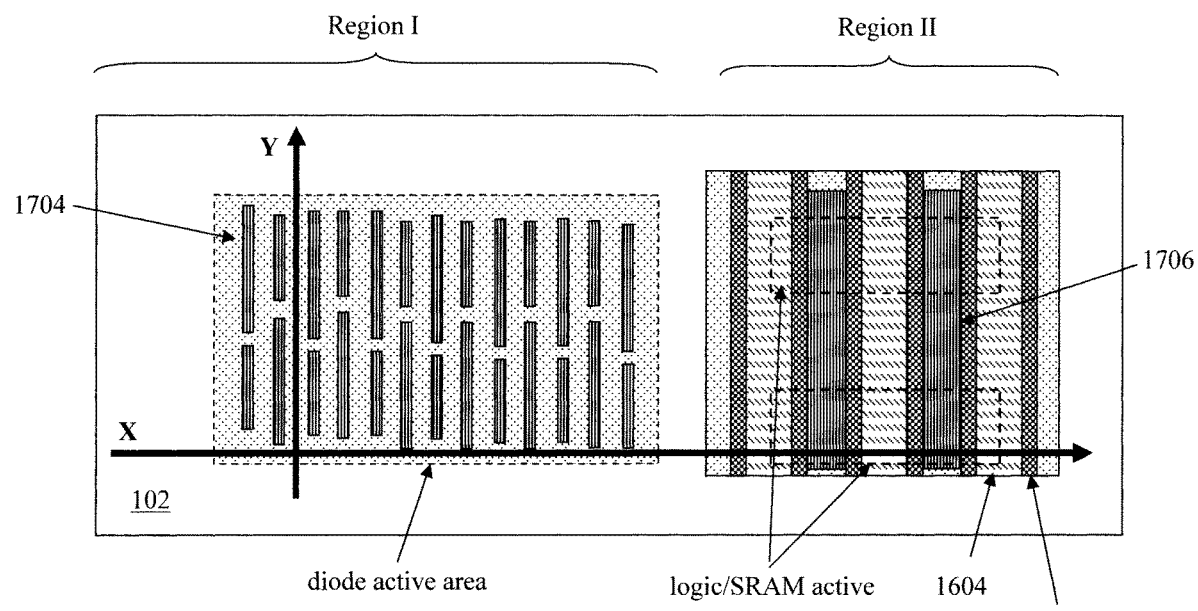
FIG. 18 is a top-down diagram illustrating an exemplary layout of the first and second source/drain contacts in the diode active area/Region I and the logic/SRAM active area/Region II, respectively, according to an embodiment of the present invention.

FIG. 18 is a top-down diagram illustrating an exemplary layout of the source/drain contacts 1704 and 1706 in the diode active area/Region I and the logic/SRAM active area/Region II, respectively. For clarity, the overlying interlayer dielectric 1702 is not shown. As shown in FIG. 18, many source/drain contacts 1704 are formed in the diode active area/Region I to minimize contact resistance.

Figure 19:
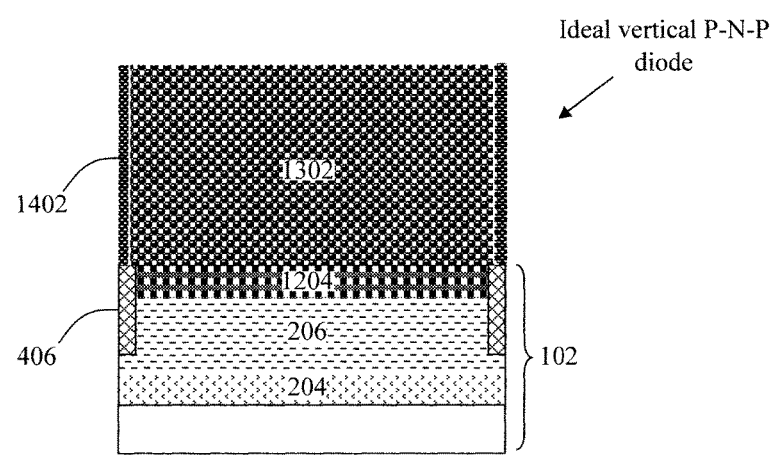
FIG. 19 is a Y cross-sectional view illustrating the present ideal vertical P-N-P diode structure according to an embodiment of the present invention.

FIG. 19 (a Y cross-sectional view) is provided to highlight the unique aspects of the present ideal vertical P-N-P diode structure formed by the above-described process. Namely, as shown in FIG. 19, and as described above, the present ideal vertical P-N-P diode structure has P-N-P vertical implanted layers Psub implant 204/Nwell implant 206/P+ implant 1204, with a continuous p-type source/drain region epitaxial material 1302 grown on top of the P-N-P vertical implanted layers.

Several variations of the above-described process flow are contemplated herein. For instance, in an alternative embodiment now described by way of reference to FIGS. 20-21, the remnants of the bottom dielectric isolation layer 802 and dielectric spacers 804 are not removed from the diode active area/Region I, but are kept in place for edge placement and confinement of the source/drain region epitaxial material 1302. As highlighted above, doing so helps to minimize the edge effects due to the epitaxy crossing over from the Nwell implant 206 region to the shallow trench isolation regions 406. Like structures are numbered alike in the figures and, unless otherwise noted, are formed in the same manner and from the same materials as provided above. Further, some of the steps described above in conjunction with multiple figures may, for brevity, be consolidated into a single figure when describing the same steps. Reference may be made above for those details.

This alternative embodiment begins in the same manner as described in conjunction with the description of FIGS. 1-10 above, i.e., the Psub implant 204 and Nwell implant 206 are formed in substrate 102, the nanosheet stack 302 is formed on the substrate 102 and then patterned into individual stack 402 in the (first) diode active area/Region I and stack 404 in the (second) logic/SRAM active area/Region II of the substrate 102, shallow trench isolation regions 406 are formed in the substrate 102 between the stacks 402 and 404, a sacrificial gate oxide 408 is formed on the stacks 402 and 404, sacrificial gate hardmasks 502 and sacrificial gates 504 are formed on the stack 404 in logic/SRAM active area/Region II, the first sacrificial nanosheet 304 is partially and fully removed from the stacks 402 and 404, respectively, dielectric spacers 804 are formed on the stack 402 and alongside the sacrificial gates 504 over stack 404 along with bottom dielectric isolation 802, the dielectric spacers 804 are recessed, the stack 402 is removed from the diode active area/Region I, and inner spacers 1002 are formed alongside the sacrificial nanosheets 306a,b,c,etc. in the logic/SRAM active area/Region II. Thus, FIG. 20 follows from what is shown in FIGS. 10A and 10B.

Figures 20A, 20B:
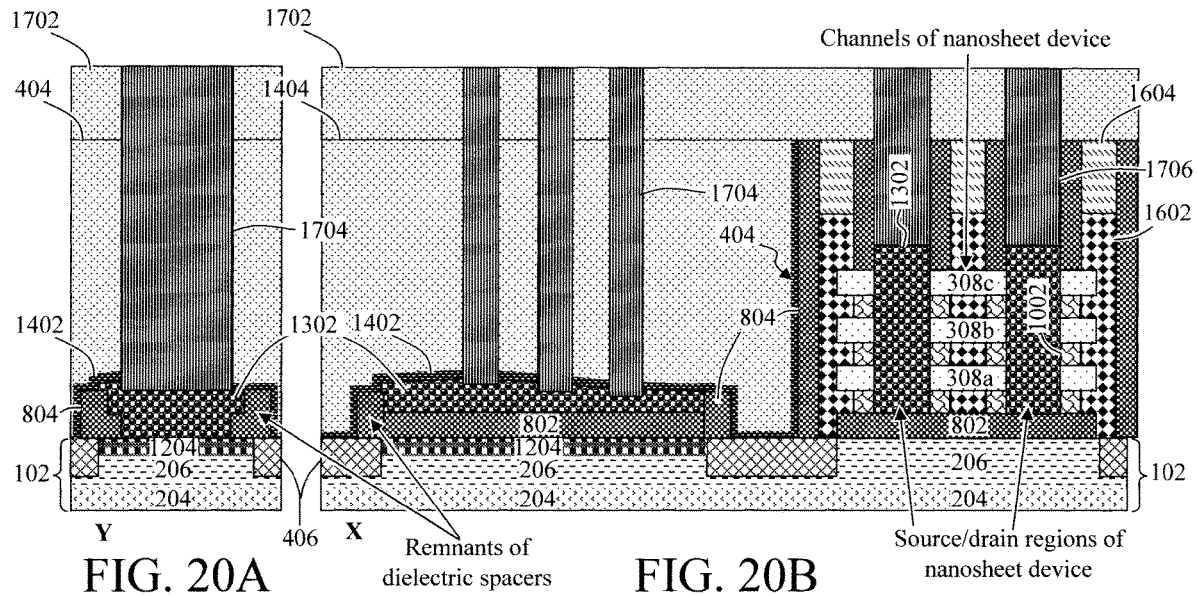
FIG. 20A is a Y cross-sectional view which follows from FIG. 10A illustrating, according to an alternative embodiment, the source/drain region epitaxial material grown in the diode active area/Region I having been confined by remnants of the dielectric spacers to the area over the Psub implant/Nwell implant/P+ implant.
FIG. 20B is an X cross-sectional view which follows from FIG. 10B illustrating, according to the alternative embodiment, the source/drain region epitaxial material grown in the diode active area/Region I having been confined by the remnants of the dielectric spacers to the area over the Psub implant/Nwell implant/P+ implant according to an embodiment of the present invention.

However, in this embodiment, the remnants of the bottom dielectric isolation layer 802 and (recessed) dielectric spacers 804 are not removed from the diode active area/Region I. Accordingly, as shown in FIG. 20A (a Y cross-sectional view) and FIG. 20B (an X cross-sectional view), the source/drain region epitaxial material 1302, grown in the diode active area/Region I as described above, is confined by the remnants of the dielectric spacers 804 to the area over the Psub implant 204/Nwell implant 206/P+ implant 1204. The remainder of the process is the same as above, i.e., deposition of contact etch stop liner 1402, interlayer dielectric 1404, removal of the sacrificial gate hardmasks 502, sacrificial gates 504 and sacrificial nanosheets 306a,b,c,etc. in the logic/SRAM active area/Region II, formation of the replacement gates 1602, deposition of interlayer dielectric 1702 and formation of source/drain contacts 1704 and 1706 in the diode active area/Region I and in the logic/SRAM active area/Region II, respectively.

Figure 21:
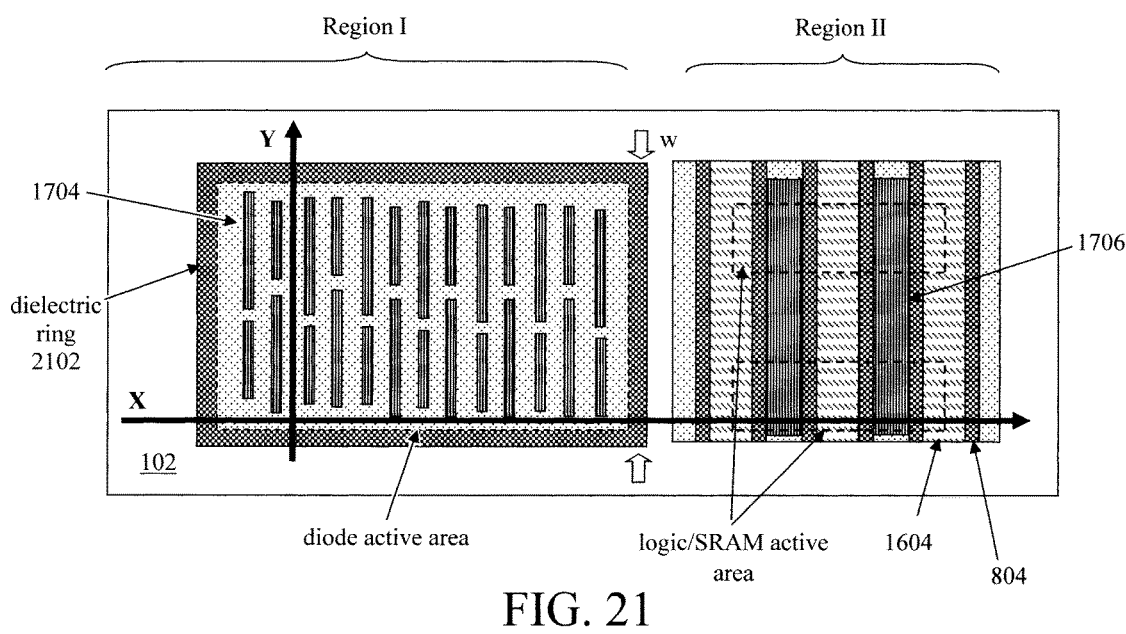
FIG. 21 is a top-down diagram illustrating a ring of the same dielectric material as the bottom dielectric isolation layer and the dielectric spacers surrounding the source/drain region epitaxial material in the diode active area/Region I according to an embodiment of the present invention.

As shown in FIG. 21 (a top-down diagram), the result is the formation of a ring 2102 of the same dielectric material as the bottom dielectric isolation layer 802 and the dielectric spacers 804 surrounding the source/drain region epitaxial material 1302 in the diode active area/Region I. According to an exemplary embodiment, the ring 2102 can have a width w of from about 10 nm to about 150 nm.

Figure 22:
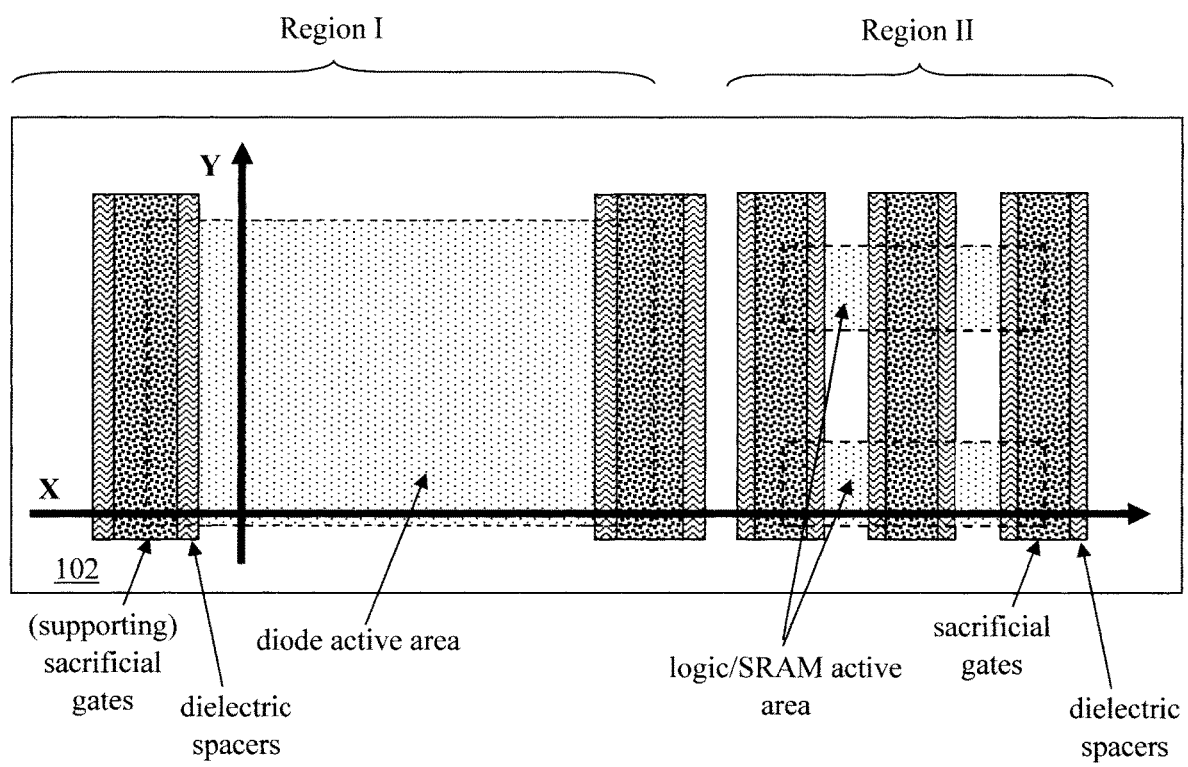
FIG. 22 is a top-down diagram which follows from FIGS. 4A and 4B illustrating, according to another alternative embodiment, how (supporting) gates can also be formed in the diode active area/Region I as they are in the logic/SRAM active area/Region II according to an embodiment of the present invention.

In another alternative embodiment now described by way of reference to FIGS. 22-35, the source/drain region epitaxial material in the diode active area/Region I can be supported by gates. For example, as shown in FIG. 22, a top-down diagram, in this alternative embodiment, gates will be formed in the diode active area/Region I as they are in the logic/SRAM active area/Region II. Doing so will enable the source/drain region epitaxial material in the diode active area/Region I to connect the substrate 102 and remnants of the active nanosheets 308a,b,c,etc. under the supporting gates. As noted above, like structures are numbered alike in the figures and, unless otherwise noted, are formed in the same manner and from the same materials as provided above. Further, some of the steps described above in conjunction with multiple figures may, for brevity, be consolidated into a single figure when describing the same steps. Reference may be made above for those details.

This alternative embodiment begins in the same manner as described in conjunction with the description of FIGS. 1-4 above, i.e., the Psub implant 204 and Nwell implant 206 are formed in substrate 102, the nanosheet stack 302 is formed on the substrate 102 and then patterned into individual stacks 402 in the (first) diode active area/Region I and stack 404 in the (second) logic/SRAM active area/Region II of the substrate 102, shallow trench isolation regions 406 are formed in the substrate 102 between the stacks 402 and 404, and a sacrificial gate oxide 408 is formed on the stacks 402 and 404. Thus, FIG. 22 follows from what is shown in FIGS. 4A and 4B.

Figures 23A, 23B:
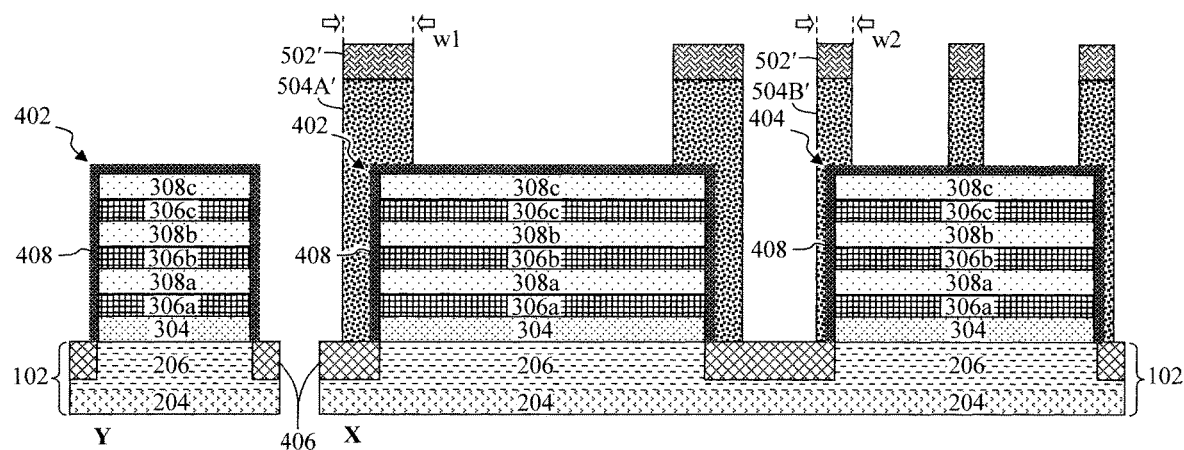
FIG. 23A is a Y cross-sectional view illustrating sacrificial gate hardmasks having been used to pattern (first) sacrificial gates and (second) sacrificial gates on the first stack in Region I (the diode active area) and on the second stack in Region II (the logic/SRAM active area) of the substrate, respectively.
FIG. 23B is an X cross-sectional view illustrating the sacrificial gate hardmasks having been used to pattern the first sacrificial gates and the second sacrificial gates on the first stack in Region I (the diode active area) and on the second stack in Region II (the logic/SRAM active area) of the substrate, respectively according to an embodiment of the present invention.

However, as shown in FIG. 23A (a Y cross-sectional view) and FIG. 23B (an X cross-sectional view), in this alternative embodiment (first) sacrificial gates 504A' and (second) sacrificial gates 504B' are formed on the stack 402 in Region I (the diode active area) and on the stack 404 in Region II (the logic/SRAM active area) of substrate 102, respectively. To do so, a suitable sacrificial gate material (see above) is first blanket deposited over both stack 402 in Region I (the diode active area) and stack 404 in Region II (the logic/SRAM active area), and then patterned using sacrificial gate hardmasks 502' in the same manner as described above to form the sacrificial gates 504A' and 504B' in those respective Regions I and II.

As shown in FIG. 23B, the (supporting) sacrificial gates 504A' formed in the diode active area/Region I are preferably larger than the sacrificial gates 504B' formed in the logic/SRAM active area/Region II. For instance, according to an exemplary embodiment, the sacrificial gates 504A' have a width w1 and the sacrificial gates 504B' have a width w2, where w1 is greater than w2, i.e., w1>w2.

Figures 24A, 24B:
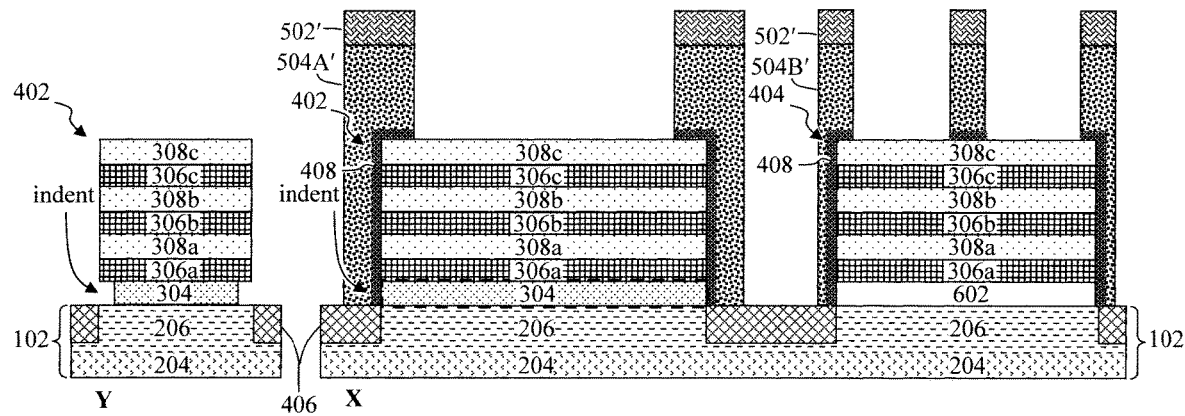
FIG. 24A is a Y cross-sectional view illustrating the exposed sacrificial gate oxide having been removed, and a selective etch having been performed to partially remove the first sacrificial nanosheet from the stack over Region I (the diode active area) of the substrate.
FIG. 24B is an X cross-sectional view illustrating the exposed sacrificial gate oxide having been removed, and the selective etch having been performed to fully remove the first sacrificial nanosheet from the stack over Region II (the logic/SRAM active area) of the substrate forming a cavity for bottom dielectric isolation according to an embodiment of the present invention.

As shown in FIG. 24A (a Y cross-sectional view) and FIG. 24B (an X cross-sectional view), in the same manner as described above, following patterning of the sacrificial gates 504A' and 504W the exposed sacrificial gate oxide 408 is removed (using, e.g., an oxide-selective etching process), and a selective etch (using, e.g., dry HCl) is performed to fully remove the sacrificial nanosheet 304 from stack 404 in Region II (the logic/SRAM active area) of substrate 102 for bottom dielectric isolation formation. As shown in FIGS. 24A and 24B, due to the larger footprint of the diode active area versus the logic/SRAM active area (as illustrated, for example, in FIG. 22), the etch to fully remove the sacrificial nanosheet 304 from stack 404 in Region II (the logic/SRAM active area) of substrate 102, only partially removes (i.e., indents the exposed outer edges of) the sacrificial nanosheet 304 in Region I (the diode active area) of substrate 102.

As shown in FIG. 24B, the sacrificial gate oxide 408 masked by the sacrificial gates 504A' and 504B' remains. The full removal of sacrificial nanosheet 304 forms a cavity 602 in stack 404, whereas indents are formed in the sacrificial nanosheet 304 at the base of stack 402. In FIG. 24B, this indenting of sacrificial nanosheet 304 is indicated using a dashed outline. Namely, in the X cross-sectional view, the indent in the sacrificial nanosheet 304 would be into the page.

Figure 25:
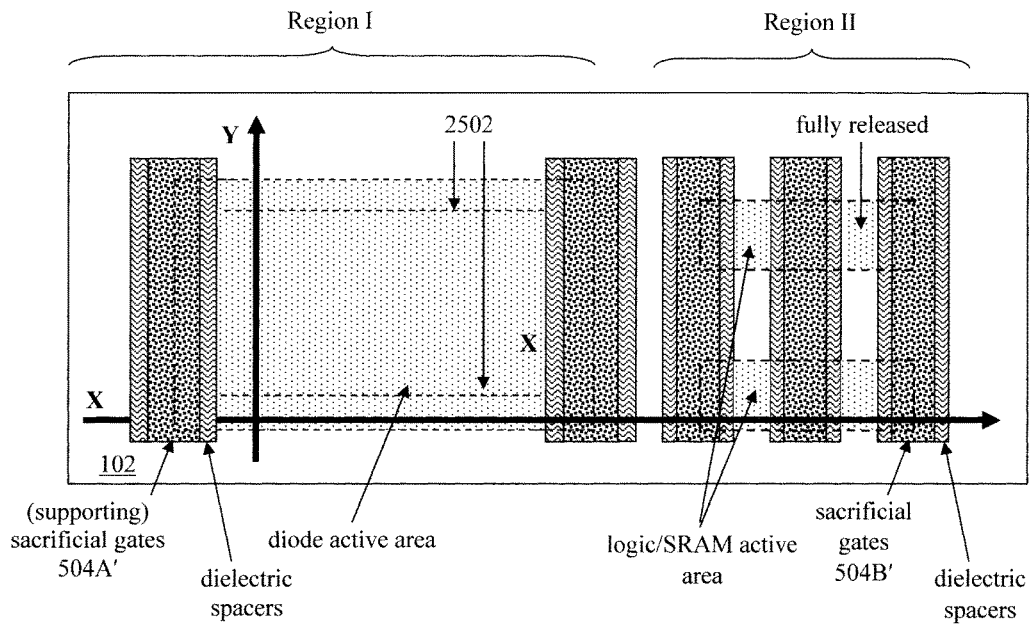
FIG. 25 is a top-down diagram illustrating how the removal of the first sacrificial nanosheet for bottom dielectric isolation formation only reaches a portion of the stack in Region I (the diode active area), while the sacrificial nanosheet is fully removed from the stack in Region II (the logic/SRAM active area) according to an embodiment of the present invention.

FIG. 25 is a top-down diagram illustrating how removal of the sacrificial nanosheet 304 for bottom dielectric isolation formation only reaches a portion of stack 402 in Region I (the diode active area) in from the outer edges of the sacrificial nanosheet 304, while the sacrificial nanosheet 304 from stack 404 in Region II (the logic/SRAM active area) of substrate 102 is fully removed. Namely, as indicated by dashed lines 2502 in FIG. 25, the bottom dielectric isolation only reaches about 100 nm into the diode active area (Region I) from the outer edges. By contrast, the sacrificial nanosheet 304 is fully released for bottom dielectric isolation formation in the logic/SRAM active area (Region II). By comparison with the with first embodiment presented above (see, e.g., FIG. 7), here the (supporting) sacrificial gates 504A' block indentation of the sacrificial nanosheet 304 from two opposing edges in Region I (the diode active area). Thus, partial removal of the sacrificial nanosheet 304 in Region I (the diode active area) occurs only from the edges orthogonal to the sacrificial gates 504A'.

Figures 26A, 26B:
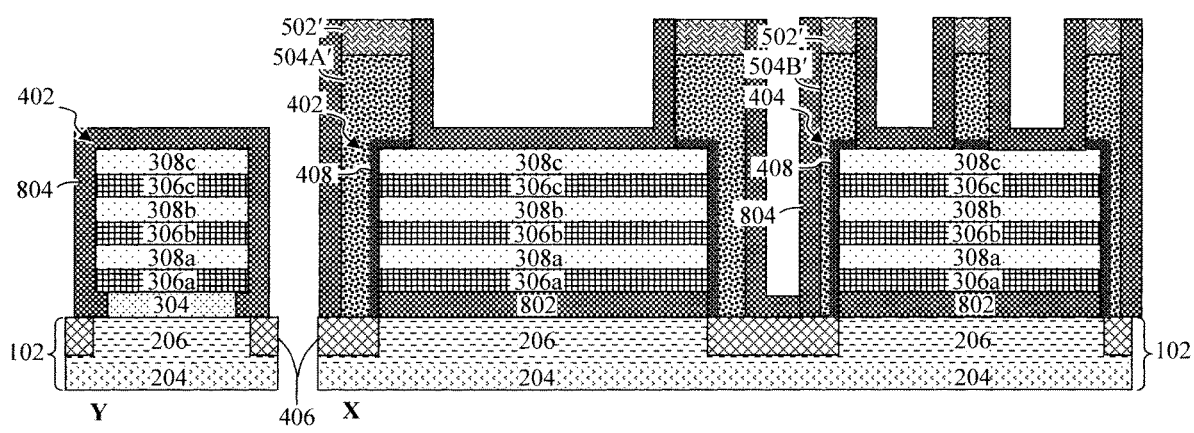
FIG. 26A is a Y cross-sectional view illustrating dielectric spacers having been formed alongside the sacrificial gate hardmasks and first sacrificial gates in the diode active area/Region I.
FIG. 26B is an X cross-sectional view illustrating a bottom dielectric isolation layer having been formed in the cavity and dielectric spacers having been formed alongside the sacrificial gate hardmasks and second sacrificial gates (in the logic/SRAM active area/Region II), and alongside the sacrificial gate hardmasks and first sacrificial gates in the diode active area/Region I according to an embodiment of the present invention.

In the same manner as described above, as shown in FIG. 26A (a Y cross-sectional view) and FIG. 26B (an X cross-sectional view), a dielectric spacer material (e.g., SiOx, SiC, SiCO and/or SiN) is then deposited over the stacks 402/404 and into/filling the cavity 602 (in the logic/SRAM active area/Region II) and indents (in the diode active area/Region I), followed by a directional (anisotropic) etching process such as reactive ion etching to pattern the dielectric spacer material into bottom dielectric isolation layer 802 in the cavity 602 and dielectric spacers 804 alongside the sacrificial gate hardmasks 502' and sacrificial gates 504B' (in the logic/SRAM active area/Region II), and alongside the sacrificial gate hardmasks 502' and sacrificial gates 504A' (in the diode active area/Region I). The bottom dielectric isolation layer 802 is visible in FIG. 26B at the bottom of stack 402 (in the diode active area/Region I). It is notable, however, that the bottom dielectric isolation layer 802 only fills the indents in the sacrificial nanosheet 304 of stack 402. Thus, the bottom dielectric isolation layer 802 in stack 402 is thinner than it is in stack 404 (in the logic/SRAM active area/Region II).

Figures 27A, 27B:
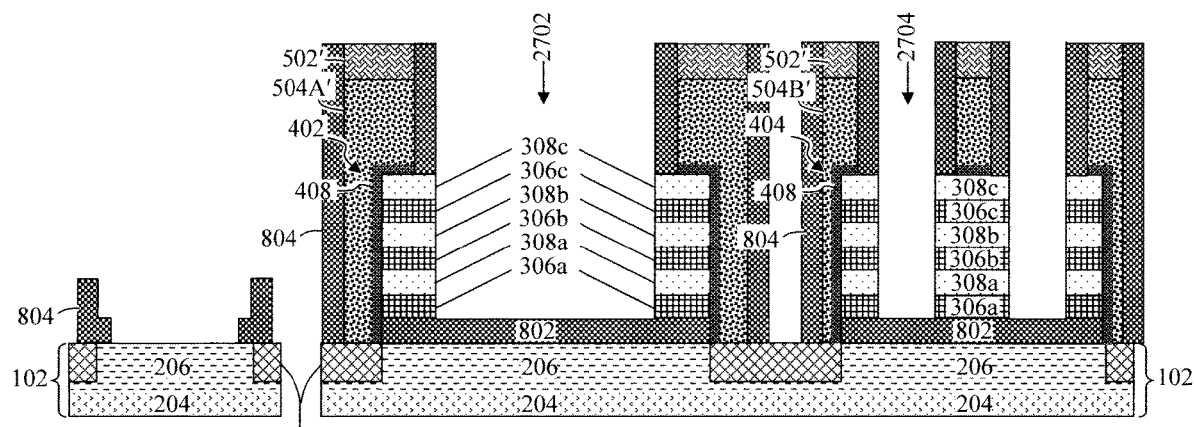
FIG. 27A is a Y cross-sectional view illustrating the dielectric spacers having been recessed, and (first/second) trenches having been patterned in both the diode active area/Region I stack and the logic/SRAM active area/Region II stack, respectively.
FIG. 27B is an X cross-sectional view illustrating the dielectric spacers having been recessed, and the first and second trenches having been patterned in both the diode active area/Region I stack and the logic/SRAM active area/Region II stack, respectively, according to an embodiment of the present invention.

In the same manner as above, as shown in FIG. 27A (a Y cross-sectional view) and FIG. 27B (an X cross-sectional view), the dielectric spacers 804 are recessed (using, e.g., reactive ion etching) to expose the underlying stacks 402 and 404 in the diode active area/Region I and the logic/SRAM active area/Region II, respectively, which are then patterned.

The recess etch removes the dielectric spacers 804 from all horizontal surfaces, including along the top of the stack 402 (in the diode active area/Region I) between the sacrificial gate hardmasks 502'/sacrificial gates 504A', and along the top of the stack 404 (in the logic/SRAM active area/Region II) between the sacrificial gate hardmasks 502'/sacrificial gates 504B'. The sacrificial gate hardmasks 502'/sacrificial gates 504A' and 504W, and the dielectric spacers 804 are then used as a mask to pattern (first/second) trenches 2702 and 2704 in the stack 402 (in the diode active area/Region I) between the sacrificial gates 504A' and in the stack 404 (in the logic/SRAM active area/Region II) between the sacrificial gates 504W, respectively using, e.g., a directional (anisotropic) etching process such as reactive ion etching. As shown in FIG. 27B, trenches 2702 and 2704 extend through each of the sacrificial nanosheets 306a,b,c,etc. and active nanosheets 308a,b,c,etc. in stacks 402 and 404, stopping on the bottom dielectric isolation layer 802. Thus, in this exemplary embodiment, the stack 402 is only partially removed from the diode active area/Region I. Namely, patterned portions of the sacrificial nanosheets 306a,b,c,etc. and active nanosheets 308a,b,c,etc. remain present under the sacrificial gates 504A', in the diode active area/Region I. By comparison, in the previous examples, the stack 402 was completely removed from the diode active area/Region I. See, e.g., FIGS. 9A and 9B, described above.

Figures 28A, 28B:
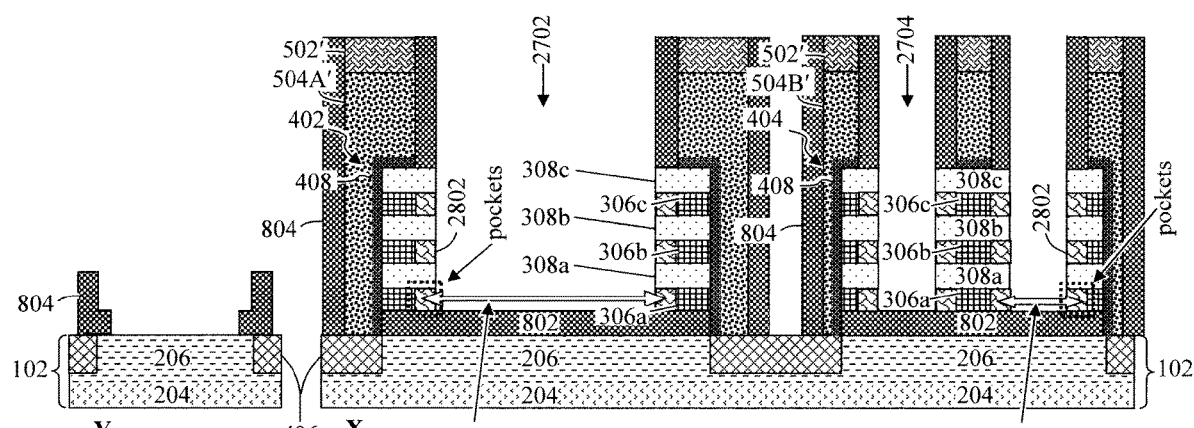
FIG. 28A is a Y cross-sectional view illustrating the (recessed) dielectric spacers in the diode active area/Region I.
FIG. 28B is an X cross-sectional view illustrating inner spacers having been formed alongside the sacrificial nanosheets in both the diode active area/Region I stack and the logic/SRAM active area/Region II stack according to an embodiment of the present invention.

As shown in FIG. 28A (a Y cross-sectional view) and FIG. 28B (an X cross-sectional view), inner spacers 2802 are formed alongside the sacrificial nanosheets 306a,b,c,etc. in both stack 402 (in the diode active area/Region I) and stack 404 (in the logic/SRAM active area/Region II). To form the inner spacers 2802, as above, a selective lateral etch is performed to recess the sacrificial nanosheets 306a,b,c,etc. exposed along the sidewalls of trenches 2702 and 2704. This recess etch forms pockets along the sidewalls of the trenches 2702 and 2704 that are then filled with a spacer material (e.g., SiN, SiOx, SiC and/or SiCO) to form the inner spacers 2802 within the pockets. Excess spacer material can be removed from the trenches 2702 and 2704 using a non-directional (isotropic) etching process.

In the same manner as above, as shown in FIG. 29A (a Y cross-sectional view) and FIG. 29B (an X cross-sectional view), a block mask 2902 (e.g., an organic planarizing layer material) is formed over/masking the stack 404 (in the logic/SRAM active area/Region II), and an etch is then used to remove exposed portions of the bottom dielectric isolation layer 802 and dielectric spacers 804 from horizontal surfaces in the diode active area/Region I. As highlighted above, this step of removing the remnants of the bottom dielectric isolation layer 802 and dielectric spacers 804 from the diode active area/Region I is optional, and embodiments are contemplated herein (see below) where they are kept in place.

Following removal of the exposed portions of the bottom dielectric isolation layer 802 and dielectric spacers 804 from horizontal surfaces in the diode active area/Region I, the block mask 2902 is removed (using, e.g., a process such as ashing).

In the same manner as above, as shown in FIG. 30A (a Y cross-sectional view) and FIG. 30B (an X cross-sectional view), an implant mask 3002 (e.g., an organic planarizing layer material) is formed over/masking the stack 404 (in the logic/SRAM active area/Region II), and a P+ implant 3004 is formed in the diode active area/Region I of substrate 102 over the Nwell implant 206 in between the sacrificial gates 504A' (see arrows 3006).

According to an exemplary embodiment, P+ implant 3004 is formed by implanting a p-type dopant(s) (such as boron (B)) to a shallow depth of from about 0 nm to about 75 nm in substrate 102 to ensure about 100 nm of Nwell implant 206 remains between the P+ implant 3004 and the underlying Psub implant 204. Following formation of the P+ implant 3004 in the diode active area/Region I of substrate 102, the implant mask 3002 is removed (using, e.g., a process such as ashing).

Advantageously, integrating the vertical P-N-P structure for the diode in this manner facilitates formation and preservation of all of the implant layers. Further, P+ implants for other purposes such as guard rings, electrostatic discharge, etc. are also done at this same point in the integration, so various implant doses, energies, types, etc. can all be done back-to-back using different masks for different locations/functions.

Figures 31A, 31B:
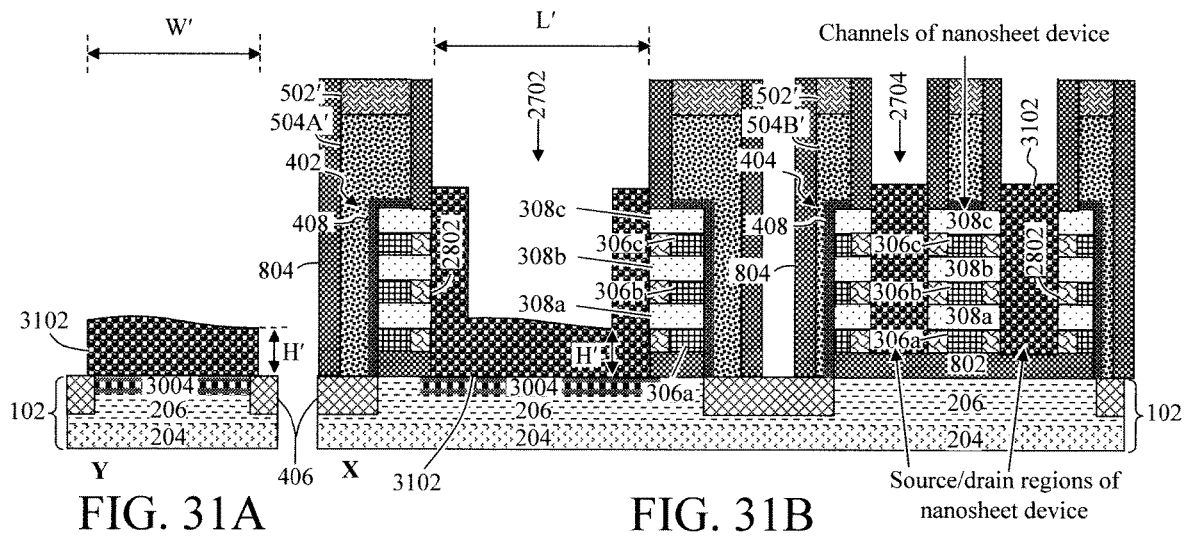
FIG. 31A is a Y cross-sectional view illustrating a source/drain region epitaxial material having been grown on the substrate in the first trench over the Psub implant/Nwell implant/P+ implant (between the first sacrificial gates) in the diode active area/Region I.
FIG. 31B is an X cross-sectional view illustrating the source/drain region epitaxial material having been grown on the substrate in the first trench over the Psub implant/Nwell implant/P+ implant (between the first sacrificial gates) in the diode active area/Region I, and in the second trenches on opposite sides of the second sacrificial gates in the logic/SRAM active area/Region II to form source/drain regions of the nanosheet logic/SRAM device according to an embodiment of the present invention.

As shown in FIG. 31A (a Y cross-sectional view) and FIG. 31B (an X cross-sectional view), a source/drain region epitaxial material 3102 is grown on the substrate 102 in trench 2702 over the Psub implant 204/Nwell implant 206/P+ implant 3004 (between sacrificial gates 504A') in the diode active area/Region I, and in the trenches 2704 on opposite sides of the sacrificial gates 504B' in the logic/SRAM active area/Region II to form source/drain regions of the nanosheet logic/SRAM device. According to an exemplary embodiment, the source/drain region epitaxial material 3102 is a p-type in-situ doped (i.e., during growth) or ex-situ doped (e.g., via ion implantation) epitaxial material such as epitaxial Si, epitaxial SiGe, etc. As provided above, suitable p-type dopants include, but are not limited to, boron (B). With inner spacers 2802 in place along the sidewalls of trenches 2702 and 2704, epitaxial growth of the source/drain region epitaxial material 3102 is templated only from the ends of the active nanosheets 308a,b,c,etc. in stacks 402 and 404 along the sidewalls of trenches 2702 and 2704.

According to an exemplary embodiment, the source/drain region epitaxial material 3102 grown in the diode active area/Region I has a width W' of from about 2 μm to about 5 μm, and a length L' of from about 3 μm to about 10 μm. See FIGS. 31A and 31B. As provided above, having width W' and length L' dimensions on the order of multiple micrometers serves to minimize perimeter effects as compared to bulk area effects for the diode. A height H' of the source/drain region epitaxial material 3102 grown in the diode active area/Region I can vary. However, the epitaxial material 3102 has to be continuous across all of the diode connections, see below. As shown in FIG. 31B, the source/drain region epitaxial material 3102 grown in the diode active area/Region I has a unique shape with vertical sidewalls that contact the patterned portions of the active nanosheets 308a,b,c,etc. beneath the sacrificial gates 504A', and a flat (single, continuous) bottom that contacts the substrate 102.

Figures 32A, 32B:
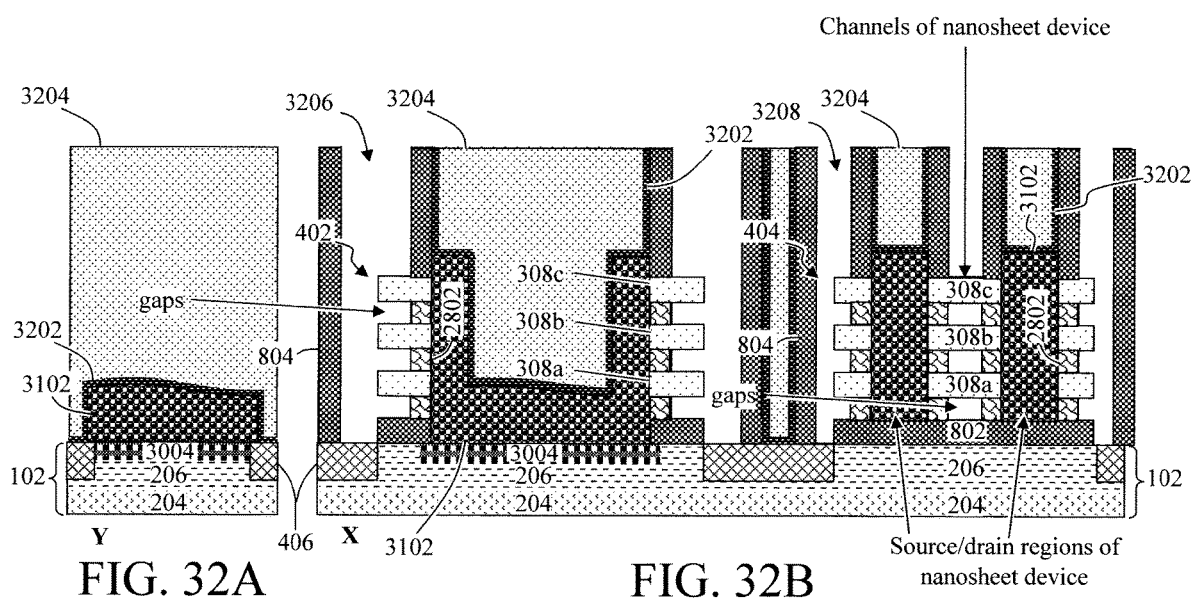
FIG. 32A is a Y cross-sectional view illustrating a contact etch stop liner having been deposited over the source/drain region epitaxial material in the diode active area/Region I, followed by a (first) interlayer dielectric.
FIG. 32B is an X cross-sectional view illustrating the contact etch stop liner having been deposited over the source/drain region epitaxial material in the diode active area/Region I and in the logic/SRAM active area/Region II, followed by the first interlayer dielectric, the sacrificial gate hardmasks, sacrificial gates and sacrificial gate oxide having been removed forming first/second gate trenches in the first interlayer dielectric over the first/second stacks, and the sacrificial nanosheets having been selectively removed from the first/second stacks through the first/second gate trenches forming gaps between the active layers according to an embodiment of the present invention.

In the same manner as above, as shown in FIG. 32A (a Y cross-sectional view) and FIG. 32B (an X cross-sectional view), a contact etch stop liner 3202 (e.g., SiBCN, SiCO and/or SiN) is deposited onto the device structure over the source/drain region epitaxial material 3102 in both the diode active area/Region I and the logic/SRAM active area/Region II, followed by an interlayer dielectric 3204 (e.g., SiOx, pSiCOH, etc.). According to an exemplary embodiment, contact etch stop liner 3202 has a thickness of from about 1 nm to about 3 nm. The sacrificial gate hardmasks 502', the sacrificial gates 504A' and 504B', and sacrificial gate oxide 408 are then removed relative to the dielectric spacers 804 and inner spacers 2802 forming first/second gate trenches 3206 and 3208 in the interlayer dielectric 3204 over the stack 402 (in the diode active area/Region I) and over the stack 404 (in the logic/SRAM active area/Region II) between the source/drains regions of the nanosheet device, respectively. As shown in FIG. 32B, the sacrificial nanosheets 306a,b,c,etc. of stack 402 and stack 404, now accessible through the gate trenches 3206 and 3208, respectively, are then selectively removed which releases the active nanosheets 308a,b,c,etc. from both the stack 402 and the stack 404 (i.e., in a channel region of the nanosheet device). Gaps are now present in the stacks 402 and 404 in between the active nanosheets 308a,b,c,etc. As provided above, the active nanosheets 308a,b,c,etc. in the logic/SRAM active area/Region II form the channels of the nanosheet device.

In the same manner as above, as shown in FIG. 33A (a Y cross-sectional view) and FIG. 33B (an X cross-sectional view), first/second replacement gates 3302 and 3304 are next formed in the gate trenches 3206 and 3208 and the gaps that fully surround a portion of each of the active nanosheets 308a,b,c,etc. in stacks 402 and 404 in a gate-all-around configuration, and dielectric caps 3306 (e.g., SiOx and/or SiN) are formed in the gate trenches 3206 and 3208 over the replacement gates 3302 and 3304. The replacement gates may also be referred to herein simply as 'gates.' As highlighted above, the replacement gates 3302 physically support the source/drain region epitaxial material 3102 in the diode active area/Region I. As such, replacement gates 3302 may also be referred to herein as 'support gates.' Further, the replacement gates 3302 and 3304 are formed in the gate trenches 3206 and 3208 and gaps concurrently. Thus, according to an exemplary embodiment, the replacement gates 3302 and 3304 are formed from a same combination of materials as one another.

For instance, referring to magnified views 3300 and 3301 in FIG. 33B, replacement gates 3302 and 3304 each include a conformal (e.g., high-κ) gate dielectric 3308 lining each of the gate trenches 3206 and 3208 and gaps, at least one workfunction-setting metal 3310 disposed over the gate dielectric 3308, and a (low-resistance) fill metal 3312 disposed over the workfunction-setting metal(s) 3310. Suitable gate dielectric materials, workfunction-setting metals and low-resistance fill metals were provided above.

As shown in FIG. 34A (a Y cross-sectional view) and FIG. 34B (an X cross-sectional view), an interlayer dielectric 3402 (e.g., SiOx, pSiCOH, etc.) is deposited onto the interlayer dielectric 3204 in both the diode active area/Region I and the logic/SRAM active area/Region II and, using the above-described metallization techniques, (first and second) source/drain contacts 3404 and 3406 are formed in the interlayer dielectrics 3402 and 3204 over, and in direct contact with the source/drain region epitaxial material 3102 in the diode active area/Region I and the logic/SRAM active area/Region II, respectively. For clarity, the terms 'first' and 'second' may also be used herein when referring to interlayer dielectric 3204 and interlayer dielectric 3402, respectively.

As shown in FIGS. 34A and 34B, multiple source/drain contacts 3404 are formed contacting the source/drain region epitaxial material 3102 in the diode active area/Region I. As provided above, the height of the source/drain region epitaxial material 3102 in the diode active area/Region I can vary. Notwithstanding, as shown in FIGS. 34A and 34B, the (single) epitaxial material 3102 is continuous across all of the source/drain contacts 3404. As shown in FIG. 34B, source/drain contacts 3406 directly contact the source/drain region epitaxial material 3102 in the logic/SRAM active area/Region II, i.e., the source/drains regions of the nanosheet device.

Figure 35:
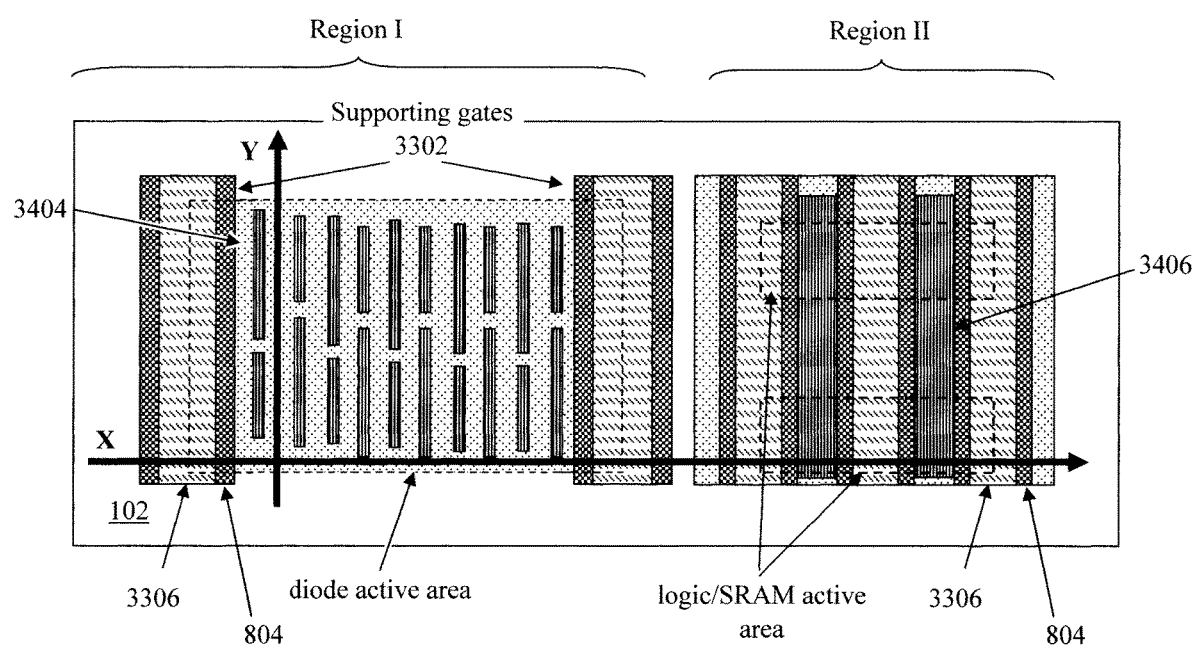
FIG. 35 is a top-down diagram illustrating an exemplary layout of the first and second source/drain contacts in the diode active area/Region I and the logic/SRAM active area/Region II, respectively, according to an embodiment of the present invention.

FIG. 35 is a top-down diagram illustrating an exemplary layout of the source/drain contacts 3404 and 3406 in the diode active area/Region I and the logic/SRAM active area/Region II, respectively. For clarity, the overlying interlayer dielectric 3402 is not shown. As shown in FIG. 35, (supporting) replacement gates 3302 contact opposite sides of the source/drain region epitaxial material 3102 in the diode active area/Region I.

Figures 36A, 36B:
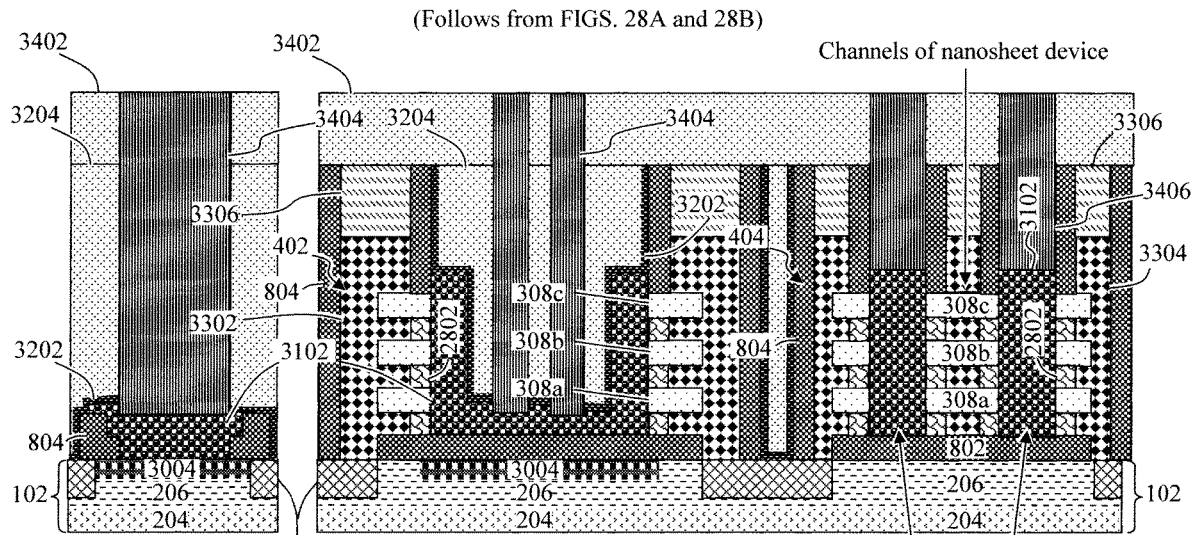
FIG. 36A is a Y cross-sectional view which follows from FIG. 28A illustrating, according to an alternative embodiment, the source/drain region epitaxial material grown in the diode active area/Region I having been confined by remnants of the dielectric spacers to the area over the Psub implant/Nwell implant/P+ implant.
FIG. 36B is an X cross-sectional view which follows from FIG. 28B illustrating, according to the alternative embodiment, the source/drain region epitaxial material grown in the diode active area/Region I having been confined by remnants of the dielectric spacers to the area over the Psub implant/Nwell implant/P+ implant according to an embodiment of the present invention.
Figure 37:
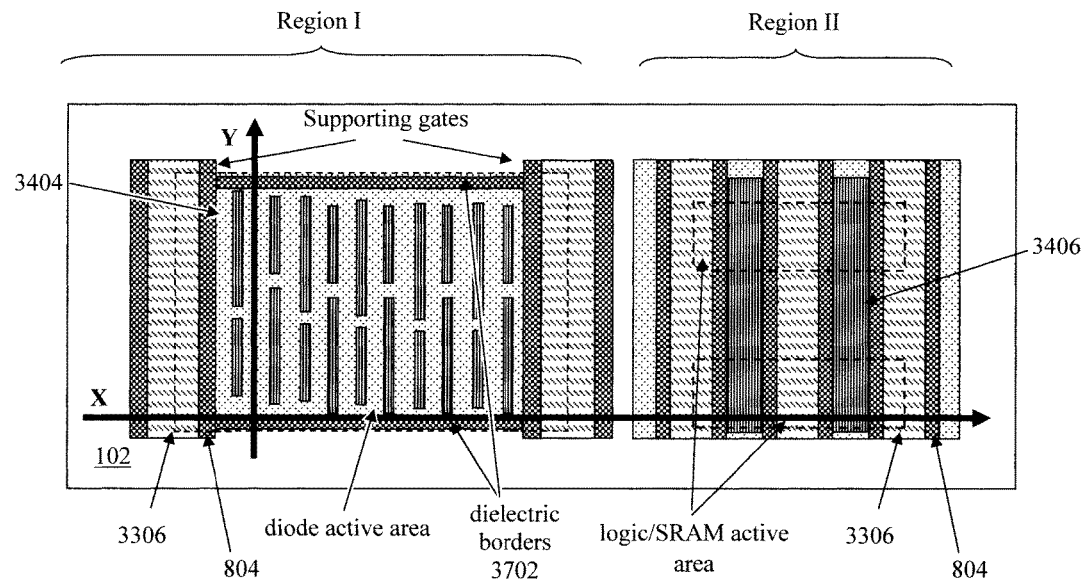
FIG. 37 is a top-down diagram illustrating borders of the same dielectric material as the bottom dielectric isolation layer and the dielectric spacers present on opposite sides of the source/drain region epitaxial material in the diode active area/Region I according to an embodiment of the present invention.

In yet another alternative embodiment now described by way of reference to FIGS. 36-37, the source/drain region epitaxial material in the diode active area/Region I is supported by gates as in the immediately preceding example, however the remnants of the bottom dielectric isolation layer 802 and dielectric spacers 804 are not removed from the diode active area/Region I, but are kept in place for edge placement and confinement of the source/drain region epitaxial material 3102. As highlighted above, doing so helps to minimize the edge effects due to the epitaxy crossing over from the Nwell implant 206 region to the shallow trench isolation regions 406. Like structures are numbered alike in the figures and, unless otherwise noted, are formed in the same manner and from the same materials as provided above. Further, some of the steps described above in conjunction with multiple figures may, for brevity, be consolidated into a single figure when describing the same steps. Reference may be made above for those details.

This alternative embodiment begins in the same manner as described in conjunction with the description of FIGS. 22-28 above, i.e., the Psub implant 204 and Nwell implant 206 are formed in substrate 102, the nanosheet stack 302 is formed on the substrate 102 and then patterned into individual stacks 402 in the (first) diode active area/Region I and stack 404 in the (second) logic/SRAM active area/Region II of the substrate 102, shallow trench isolation regions 406 are formed in the substrate 102 between the stacks 402 and 404, a sacrificial gate oxide 408 is formed on the stacks 402 and 404, sacrificial gate hardmasks 502' and sacrificial gates 504A' and 504B' are formed on the stack 402 in the diode active area/Region I and on the stack 404 in logic/SRAM active area/Region II, respectively, the first sacrificial nanosheet 304 is partially and fully removed from the stacks 402 and 404, respectively, dielectric spacers 804 are formed on the stacks 402/404 and alongside the sacrificial gates 504A' and 504B' along with bottom dielectric isolation layer 802, the dielectric spacers 804 are recessed, the stack 402 is partially removed from the diode active area/Region I, and inner spacers 2802 are formed alongside the sacrificial nanosheets 306a,b,c,etc. in both the diode active area/Region I stack 402 and the logic/SRAM active area/Region II stack 404. Thus, FIGS. 36A and 36B follow from what is shown in FIGS. 28A and 28B.

However, in this embodiment, the remnants of the bottom dielectric isolation layer 802 and (recessed) dielectric spacers 804 are not removed from the diode active area/Region I. Accordingly, as shown in FIG. 36A (a Y cross-sectional view) and FIG. 36B (an X cross-sectional view), the source/drain region epitaxial material 3102, grown in the diode active area/Region I as described above, is confined by the remnants of the dielectric spacers 804 to the area over the Psub implant 204/Nwell implant 206/P+ implant 3004. The remainder of the process is the same as above, i.e., deposition of contact etch stop liner 3202, interlayer dielectric 3204, removal of the sacrificial gate hardmasks 502', sacrificial gates 504A'/504B' and sacrificial nanosheets 306a,b, c,etc. in both the diode active area/Region I and the logic/SRAM active area/Region II, formation of the replacement gates 3302 and 3304, deposition of interlayer dielectric 3402 and formation of source/drain contacts 3404 and 3406 in the diode active area/Region I and in the logic/SRAM active area/Region II, respectively.

As shown in FIG. 37 (a top-down diagram), the result is the formation of borders 3702 of the same dielectric material as the bottom dielectric isolation layer 802 and the dielectric spacers 804 on opposite sides of the source/drain region epitaxial material 3102 in the diode active area/Region I. Namely, due to the presence of the sacrificial gates 504A' in the diode active area/Region I, a full ring of the dielectric material around the source/drain region epitaxial material 3102 is not present as in the earlier example, but only on two opposing sides of the source/drain region epitaxial material 3102.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor structure, comprising:
    a diode in a first region of a bulk substrate, wherein the diode comprises P-N-P vertical implanted layers present in the bulk substrate, and a single source/drain region epitaxial material disposed directly on a top layer of the P-N-P vertical implanted layers; and
    a nanosheet device with a bottom dielectric isolation layer in a second region of the bulk substrate.

2. The semiconductor structure of claim 1, wherein the P-N-P vertical implanted layers comprise:
    a Psub implant in the bulk substrate;
    an Nwell implant in the bulk substrate over the Psub implant; and
    a P+ implant in the second region of the bulk substrate over the Nwell implant.

3. The semiconductor structure of claim 1, further comprising:
    multiple source/drain contacts to the single source/drain region epitaxial material disposed on the P-N-P vertical implanted layers.

4. The semiconductor structure of claim 1, wherein the single source/drain region epitaxial material disposed on the P-N-P vertical implanted layers has a width W of from about 2 μm to about 5 μm, and a length L of from about 3 μm to about 10 μm.

5. The semiconductor structure of claim 1, wherein the single source/drain region epitaxial material disposed on the P-N-P vertical implanted layers has a varying height H.

6. The semiconductor structure of claim 1, further comprising:
    a ring of a same material as the bottom dielectric isolation layer surrounding the single source/drain region epitaxial material disposed on the P-N-P vertical implanted layers.

7. The semiconductor structure of claim 1, further comprising:
    gates contacting opposite ends of the single source/drain region epitaxial material disposed on the P-N-P vertical implanted layers.

8. A semiconductor structure, comprising:
    a diode in a first region of a bulk substrate, wherein the diode comprises P-N-P vertical implanted layers present in the bulk substrate, and a single source/drain region epitaxial material disposed directly on a top layer of the P-N-P vertical implanted layers; and
    a nanosheet device with a bottom dielectric isolation layer in a second region of the bulk substrate, wherein the nanosheet device comprises nanosheet channels and gates that surround a portion of each of the nanosheet channels in a gate-all-around configuration.

9. The semiconductor structure of claim 8, wherein the P-N-P vertical implanted layers comprise:
    a Psub implant in the bulk substrate;
    an Nwell implant in the bulk substrate over the Psub implant; and
    a P+ implant in the first region of the bulk substrate over the Nwell implant.

10. The semiconductor structure of claim 8, further comprising:
    multiple source/drain contacts to the single source/drain region epitaxial material disposed on the P-N-P vertical implanted layers.

11. The semiconductor structure of claim 8, wherein the single source/drain region epitaxial material disposed on the P-N-P vertical implanted layers has a width W of from about 2 μm to about 5 μm, and a length L of from about 3 μm to about 10 μm.

12. The semiconductor structure of claim 8, wherein the single source/drain region epitaxial material disposed on the P-N-P vertical implanted layers has a varying height H.

13. The semiconductor structure of claim 8, further comprising:
    a ring of a same material as the bottom dielectric isolation layer surrounding the single source/drain region epitaxial material disposed on the P-N-P vertical implanted layers.

14. The semiconductor structure of claim 8, further comprising:
    first gates contacting opposite ends of the single source/drain region epitaxial material disposed on the P-N-P vertical implanted layers, wherein the gates that surround the portion of each of the nanosheet channels comprise second gates.

15. The semiconductor structure of claim 14, wherein the single source/drain region epitaxial material contacts both the bulk substrate and patterned portions of the nanosheet channels under the first gates.

16. The semiconductor structure of claim 14, wherein the first gates and the second gates comprise a same combination of materials.

17. A method of fabricating a semiconductor structure, the method comprising:
    performing a Psub implant in a bulk substrate, including in a first region of the bulk substrate;

performing an Nwell implant in the bulk substrate over the Psub implant;

forming a nanosheet device with nanosheet channels and a bottom dielectric isolation layer in a second region of the bulk substrate;

performing a P+ implant in the first region of the bulk substrate over the Nwell implant; and concurrently forming a source/drain region epitaxial material directly on the P+ implant in the first region of the bulk substrate and in source/drain regions of the nanosheet device in the second region of the bulk substrate.

18. The method of claim 17, further comprising:

forming a nanosheet stack on the first region and the second region of the bulk substrate; and selectively removing the nanosheet stack from the first region of the bulk substrate.

19. The method of claim 17, further comprising:

forming a ring of a same material as the bottom dielectric isolation layer surrounding the source/drain region epitaxial material in the first region of the bulk substrate.

20. The method of claim 17, further comprising:

concurrently forming first gates in the first region of the bulk substrate that contact opposite ends of the source/drain region epitaxial material, and second gates in the second region of the bulk substrate that surround a portion of each of the nanosheet channels in a gate-all-around configuration.

* * * * *